United States Patent [19]
Braunstein et al.

[11] Patent Number: 5,988,856
[45] Date of Patent: Nov. 23, 1999

[54] APPARATUS FOR REAL-TIME ESTIMATION OF PRINTING MEDIUM PROPERTIES AND METHOD FOR THE USE THEREOF

[75] Inventors: Daniel J. Braunstein, Somerville; Haruhiko Asada, Concord, both of Mass.

[73] Assignee: Massachusetts Institute of Technology, Cambridge, Mass.

[21] Appl. No.: 08/299,709

[22] Filed: Aug. 31, 1994

[51] Int. Cl.[6] .............................. G06F 19/00; G06G 7/64; G06G 7/66
[52] U.S. Cl. .................... 364/474.02; 101/123; 101/126; 101/129
[58] Field of Search ........................ 364/474.02, 474.03, 364/474.04, 474.05; 101/123, 126, 129

[56] References Cited

U.S. PATENT DOCUMENTS

| | | | |
|---|---|---|---|
| 4,817,524 | 4/1989 | Riemer | 101/129 |
| 5,052,291 | 10/1991 | Takahashi et al. | 101/129 |
| 5,174,201 | 12/1992 | Andris et al. | 101/129 |
| 5,436,028 | 7/1995 | Becher et al. | 427/96 |

OTHER PUBLICATIONS

Liu, J. et al, "Development of 0.5 and 0.65 mm Pitch QPF Technology in Surface Mounting", IEEE/CHMT Int'l Electronics Manufacturing Technology Symposium, 1993, pp. 52–55.

J. Owczarek et al, "A Study of the Off–Contact Screen Printing Process—Part 1: Model of the Printing Process and Some Results Derived From Experiments", IEEE Transactions on Components, Hybrids and Manufaacturing Technology, vol. 13, No. 2, Jun. 1990, pp. 358–367.

J. Owczarek et al, "A Study of the Off–Contact Screen Printing Process—Part II:Analysis of the Model of the Printing Process", IEEE Transactions on Components, Hybrids, and Manufacturing Technology, vol. 13, No. 2, Jun. 1990, pp. 368–375.

S. Mannan et al, "Squeegee Deformation Study in the Stencil Printing of Solder Pastes", IEEE Transactions on Components, Packaging and Manufacturing Technology—Part A, vol. 17, No. 3, Sep. 1994, pp. 470–476 (Not admitted to be prior art).

(List continued on next page.)

*Primary Examiner*—Reba I. Elmore
*Assistant Examiner*—Sheela S. Rao
*Attorney, Agent, or Firm*—Steven J. Weissburg

[57] ABSTRACT

The apparatus may be used with printing apparatus in which a media spreading member, such as a squeegee, moves relative to a surface, causing printing medium to be moved across said surface. The printing medium can be electrical solder paste and the surface can be a stencil. The apparatus is used for measuring linking parameters that are related to mechanical properties of the printing medium and the printing environment, such as viscosity and coefficient of friction. The apparatus comprises means for measuring a machine parameter that represents the force experienced by the media spreading member and means for resolving the measured force parameter into components equivalent to two orthogonal components, typically normal to the surface and tangential to it in the direction of relative motion. The apparatus also includes means for measuring a machine parameter that represents the velocity of the media spreading member relative to the surface. Means are also provided for measuring the linking parameters by determining a specific instance of a predetermined general relation among the measured machine parameters of velocity, first force component and second orthogonal force component and the linking parameters. The means for determining a specific instance of a relation may include means for comparing at least three sets of associated measured machine parameters and, based on the comparison, identifying a relationship that shows agreement with all of the sets of measured machine parameters within a predetermined level of accuracy. A typical such means for identifying such a relationship is an apparatus that applies a least squares relationship selecting technique. Suitable general relationships for Newtonian and non-Newtonian fluids may be used. A method is also disclosed.

18 Claims, 14 Drawing Sheets

OTHER PUBLICATIONS

John R. Morris et al, "Stencil Printing of Solder Paste for Fine–Pitch Surface Mount Assembly", IEEE Transactions on Components, Hybrids, and Manufacturing Technology, vol. 14, No. 3, Sep. 1991.

Evans, John W. and Beddow, John Keith, "Characterization of Particle Morphology and Rheological Behavior in Solder Paste," *IEEE Transactions on Components, Hybrids, and Manufacturing Technology,* 10(2), pp. 224–231, (Jun. 1987).

T.F. Hanrahan, P.F. Monaghan and R.D. Babikian, "Modelling of a Solder Paste Flow with a Free Surface in Stencil Printing," ASME/JSME Conference on Electronics Packaging, pp. 587–592, (1992).

C. Hancock, E. Lewis and H.K. Moffatt, "Effects of Inertia in Forced Corner Flows," Journal of Fluid Mechanics, v. 112, pp. 315–327, (1981).

Taylor, Geoffrey, "On Scraping Viscous Fluid From a Palne Surface." in *The Scientific Papers of Sir Geoffrey Ingram Taylor, Cambridge* University Press, pp. 410–413, (1971).

Taylor, Geoffrey, "Similarity Solutions of Hydrodynamic Problems," in *Aeronautics and Astronautics,* Proceedings of the Durand Centennial Conference, Stanford University Aug. 5–8, 1960), pp. 21–28, Pergaman Press, New York, (1960).

Dean, W.R. & Montagnon, P.E., "On the Steady Motion of Viscous Liquid in a Corner," *Proceedings of the Cambridge Philosophical Society,* pp. 45:389–394, (1949).

APPARATUS FOR REAL-TIME ESTIMATION OF PRINTING MEDIUM PROPERTIES AND METHOD FOR THE USE THEREOF

BACKGROUND

This invention relates generally to the field of printing using a stencil or mask and a print medium spreader, such as a squeegee or a doctor blade. It has specific applications with printing materials, such as solder paste used with surface mounted microelectronic devices ("SMDs").

Surface mount microelectronic devices (SMDs) enable highly reliable packages with improved performance, increased functionality, and decreased size. The devices have as many as 500 leads and pitches between leads as small as 0.3 mm, forcing the industry to devise and improve certain surface mount assembly processes. Unlike placement, reflow, and many other processes, where the technology used for surface mount assembly has matched or surpassed demands, the application of solder paste via stencil printing, has remained a rudimentary procedure. Defect-free solder joints require, among other things, the application of paste with sufficient pad coverage, uniform height, and favorable slumping characteristics as a necessary condition. Such defects include bridges, solder balls, and voids.

Since the quality of solder joints is a function of the environment, numerous studies have focused on characterizing the physical behavior of paste and how its properties affect printability and solderability (J. W. Evans and J. K. Beddow, "Characterization of Particle Morphology and Rheological Behavior in Solder Paste," IEEE Transactions on Components, Hybrids, and Manufacturing Technology, 10(2), pp. 224–231, (June 1987), R. E. Trease and R. L. Dietz, "Rheology of Pastes in Thick Film Printing," Solid State Technology, 15(1), pp. 39–43, (1972) and B. Rooz-Kozel, "Solder Pastes" Surface Mount Technology, (1984)). Most of these efforts have relied on off-line experimental methods for process optimization. Although these approaches have improved certain operations, many issues remain unaddressed.

One of the major problems associated with the printing process is that paste properties vary during assembly processes. Solder paste solvents evaporate as a function of time, temperature, and humidity, causing oxidation and other unfavorable conditions. Furthermore, mechanical paste properties, such as viscosity and elasticity, change with exposure to the environment as well as with the amount of work applied to the paste, e.g. squeegee speed and duration of print. These changes to the paste adversely affect joint quality and frequently require adjustment of assembly equipment to maintain product quality and throughput at tolerable levels. The retuning procedure is time consuming, costly, and requires human expertise. Off-line methods cannot be used for closed loop control. Control actions should occur dynamically in accordance with measurements which characterize real time changes to material properties, rather than occurring on an ad-hoc run-by-run basis.

Very little research has been conducted in on-line monitoring of paste properties. One study explored the application of impedance spectroscopy (C. R. Herman, V. A. Skormin and G. R. Westby, "Application of Impedance Spectroscopy for On-line Monitoring of Solder Paste," ASME Transactions, Journal of Electronic Packaging, 115, pp. 44–54, (March 1993) and M. A. Seitz, R. W. Hirthe M. N. Amin and M. H. Polczynski, "Monitoring Solder Paste Properties Using Impedance Spectroscopy," ISHM Proceedings, pp. 503–509, (1992)). This technique measures the electrical frequency response of solder paste by applying an oscillating voltage and measuring the corresponding current. An equivalent circuit model of the paste was derived from experiments, and the values of various capacitance's and resistance's were determined and correlated to physical properties and phenomena occurring within the paste. Since electrodes are placed on a test pad on the printed circuit board, electrical impedance of solder paste can be measured throughout the entire assembly process. Hence, the data gathered from impedance spectroscopy can provide useful information in terms of creating new Statistical Process Control variables.

The physics of the various assembly processes involved in paste printing are not well understood. This has precluded attempts to couple material monitoring to real time process control according to an understanding of what actually happens.

Thus, a great need exists for an understanding of the physics related to spreading solder paste and similar printing materials. In addition, a need exists for an apparatus that makes use of the physics, once understood, to control the application of printing materials such as solder paste in a real-time, closed loop manner. Accordingly, the objects of the present invention include to develop an understanding of essential aspects of the physics of the application of printed materials such as solder paste. Another object is to monitor the application of solder paste and similar materials, and to generate measurements or indications of parameters that characterize the printed material as it is being applied. It is also desirable to consider these measured parameters, and use them to control or change the process parameters of the apparatus applying the printed material.

SUMMARY

One aspect of the invention is an apparatus for use with printing apparatus in which a media spreading member, such as a squeegee, moves relative to a surface, causing printing medium to be moved across said surface. For instance, the printing medium can be electrical solder paste and the surface can be a stencil. The apparatus is used for measuring linking parameters that are related to mechanical properties of the printing medium and the printing environment, such as viscosity and coefficient of friction. The apparatus comprises means for measuring a machine parameter that represents the force experienced by the media spreading member and means for resolving the measured force parameter into components equivalent to two orthogonal components, typically normal to the surface and tangential to it in the direction of relative motion. The apparatus also includes means for measuring a machine parameter that represents the velocity of the media spreading member relative to the surface. Means are also provided for measuring the linking parameters by determining a specific instance of a predetermined general relation among the measured machine parameters of velocity, first force component and second orthogonal force component and the linking parameters.

The means for determining a specific instance of a relation may include means for comparing at least three sets of associated measured machine parameters and, based on the comparison, identifying a relationship that shows agreement with all of the sets of measured machine parameters within a predetermined level of accuracy. A typical such means for identifying such a relationship is an apparatus that applies a least squares relationship selecting technique, such as a suitably programmed general purpose digital computer, or a dedicated device.

The general relationship may be of the form $F_x=b_1V_{sq}+b_2F_y+b_3$, where $F_x$ is the force tangential to the surface, $F_y$ is the force normal to the surface, $V_{sq}$ is the relative velocity, and $b_{1,2,3}$ are the linking parameters to be measured. In such a case, $b_2$ represents the coefficient of friction between the surface and the spreading member, $b_3$ represents what can be considered a yield point of the printing medium and $b_1$ represents a factor related to the viscosity of the fluid, where $b_1=a_1f_1(\alpha)+a_2f_2(\alpha)$, where $a_1=2\mu\ln(L/a)$, $a_2=-2\eta\mu\ln(L/a)$, $f_1(\alpha)$ and $f_2(\alpha)$ are the nonlinear, trigonometric functions, $L/a$ is a measure of the volume of printed medium being spread and $\mu$ is the viscosity of the fluid. This relationship is very useful if the fluid is Newtonian, or if the process is conducted on the fluid in a region of Newtonian behavior.

For fluids that are not Newtonian, a useful form for the general relation is $F_x=b_1'V_{sq}^{b'_4}+b_2'F_y$, where $b_1'=a_1'f_1(\alpha)+a_2'f_2(\alpha)$, $b_4'=n$, and $b_2'$ the same coefficient of friction as above. The linking parameter $b_1'$ is the same as the linking parameter $b_1$ above, except that rather than being proportional to the viscosity $\mu$, it is proportional through the same factors to a measure of the fluid's thickness, designated by k. The exponent linking factor $b_4'$ represents the degree of non-Newtonian behaviour of the fluid.

In one preferred embodiment of the apparatus of the invention, there is also included means for changing the machine settings, such as the normal force or the spreading member velocity, based on the values measured for the linking parameters.

Another embodiment of the invention is a method for determining the values of linking parameters, as described above, in a printing apparatus as described above. The method includes the steps of measuring a machine parameter that represents the force experienced by the media spreading member and resolving the measured force parameter into components equivalent to two orthogonal components. Also measured is a machine parameter that represents the velocity of the media spreading member relative to said surface. Finally, the linking parameters are measured by determining a specific instance of a predetermined general relation among said measured machine parameters of velocity, first force component and second orthogonal force component and the linking parameters.

The step of determining a specific instance of the general relation may comprise comparing at least three sets of associated measured machine parameters and, based on the comparison, identifying a specific relationship that shows agreement with all of the sets of measured machine parameters within a predetermined level of accuracy.

The step of identifying may be conducted using a least squares relationship identifying technique. The general relations and the linking parameters may be as set forth above, for Newtonian and non-Newtonian situations.

For a Newtonian situation, the step of comparing at least three sets may comprise the steps of, changing the value of said machine parameter of spreading member velocity and while doing so, changing the value of a force component equivalent to one of the two orthogonal components. Substantially simultaneously the machine parameters of spreading member velocity, and the force components equivalent to two orthogonal components are measured and associated together. The simultanaeity condition is satisfied if the parameters are substantially constant during the full measurement cycle. The associated measured machine parameters for at least three different sets of measured machine parameters are recorded and compared to at least one specific instance of said general relationship, for instance, using a least squares technique.

If the fluid exhibits non-Newtonian characteristics, a preferred method of the invention comprises maintaining the value of the machine parameter of spreading member velocity constant while changing the value of the machine parameter of the first force component (typically a normal force) and substantially simultaneously measuring the machine parameters of spreading member velocity, and the force components. These simultaneously measured measured machine parameters are associated together and recorded for at least two different sets of measured machine parameters. At least two of said different recorded sets of measured machine parameters are compared and the value is determined of a first linking parameter that corresponds to a coefficient of friction between said surface and said media spreading member, based on a comparison of the at least two recorded sets.

After the first linking parameter is determined, the method continues, with the step of changing the value of the machine parameter of spreading member velocity through a plurality of different instances and substantially simultaneously measuring said machine parameters of spreading member velocity, and said force components equivalent to two orthogonal components. The measured machine parameters are associated together and recorded for at least two different sets of measured machine parameters. At least two of the different recorded sets of measured machine parameters are compared and, based on the comparison and based on the first linking parameter, the values of a second and a third linking parameter are determined.

BRIEF DESCRIPTION OF THE DRAWINGS

These and other features, aspects, and advantages of the present invention will become better understood with regard to the following description, appended claims and accompanying drawings, where:

DETAILED DESCRIPTION

Figure 1:
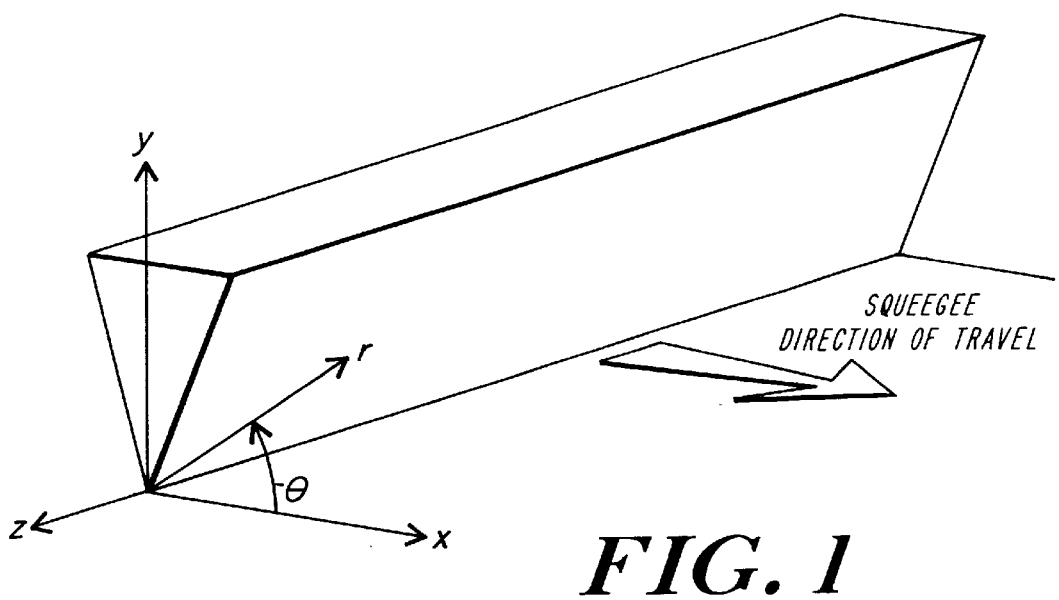
FIG. 1 is a schematic representation of an application squeegee, showing coordinate axes used in this discussion.

The present invention is useful for many different types of printing operations that use a stencil, where the printing medium is pressed through the stencil by print medium spreading, such as a squeegee, doctor blade or similar type device. Such printing operations include silk screen printing onto textiles, carpets and papers and other substrates. An operation where the control of the printed medium is highly critical is the printing of solder paste for use with SMDs. For this reason, the following discussion focuses on printing solder paste through stencil apertures, and the properties and analysis of solder paste. However, the invention may also be used with the other printing operations, and even with printing operations that do not use a stencil, where a printing medium is spread by a blade-like device over a surface.

One aspect of the present invention is a novel and more accurate understanding of the physical phenomena that take place during the printing operation. Another aspect of the invention is a new description of these physical phenomena, using appropriate relations. A further aspect of the invention is the realization that certain aspects of an ideal description of these physical phenomena are not necessary for a practical understanding of the phenomena, and that a reduced set of aspects of an ideal description are sufficient for such a practical understanding. Another important aspect of the invention is the design of an apparatus that can measure linking parameters that identify the reduced set of aspects, and generate signals indicative of those linking parameters. A related aspect of the invention is a method of using the apparatus to generate the signals that indicate these linking parameters, and also to change machine settings such as squeegee speed, forces and angle, in light of the linking parameters.

Stencil Printing and Paste Properties

Solder paste is a suspension of solder powder in a flux binder, containing additional additives to tailor certain characteristics, such as the ability of the paste to retain its shape, adhere to the substrate, and resist oxidation. Selection of the paste largely depends on the pitch (distance between leads) for which the pattern is to be printed. Factors which influence the selection of a particular paste include the metallurgical composition, solids content, size and shape of the solder powder, and rheological characteristics. Ultimately, solderability of the paste is of concern. Joints must be produced with high conductivity and resistance to thermal fatigue and corrosion. Solderability is clearly a function of the type of solder used, but the quality of joints also depends on the soldering and application processes. (Other types of printing media similarly typically include a pigment or other substance in a binder, with appropriate additives.)

For solder paste printing, the most relevant rheological properties of the solder paste are: its resistance to flow under an applied stress; and its ability to retain its shape after stencil release. The resistance to fluid flow under an applied load is measured by the viscosity, while the ability of the flux binder to suspend the solder particles and retain its shape is governed by the fluid's elastic properties. The elastic properties of the fluid are important in small amplitude motions and high frequency excitation, but the paste's viscous properties are the dominant factors for rolling motion, which is the predominant mode of paste motion during printing, which is the focus of the invention. For this reason, elastic effects have been neglected during the development of the invention and the paste was treated only as a viscous fluid.

A Newtonian fluid is one where the rate of strain that a fluid experiences is linearly related to the stress in the fluid. For a Newtonian fluid, the tensor, $\tau$, that describes the state of stress is proportional to the rate of strain tensor, $\dot{\gamma}$. The viscosity $\mu$, is the constant of proportionality. Analytical solutions to many Newtonian viscous flow problems, with various boundary conditions, can be derived.

However, solder paste and many other printing materials exhibit non-Newtonian behavior. The relationship between stress and rate of strain is not proportional or linear. The non-Newtonian characteristics of solder paste can be described by the following power law relation for viscosity:

$$\mu(\dot{\gamma}) = k\dot{\gamma}_{(n-1)}. \qquad (1)$$

Here k is a measure of the thickness of the fluid and the exponent n is a measure of the deviation from Newtonian, proportional characteristics.

An additional characteristic of solder paste that makes analysis difficult, is that the fluid displays time dependent behavior ("thixotropic"). For instance, the fluid viscosity decreases over time due to shear thinning, but may increase over time due to solvent evaporation. Thus, the change in viscosity over time depends on how many printer passes have transpired, and factors relating to evaporation. Each has a countervailing effect on the viscosity.

Since the purpose of SMD solder printing apparati is to deposit solder paste precisely by controlling machine parameters, such as squeegee forces, angle and speed, which, in combination with the paste's mechanical properties (e.g. viscosity and elasticity) govern the process parameters such as strain rate, time, temperature and humidity, determination of the functional relation between process parameters and the mechanical properties is not necessary. This realization is an important aspect of the invention.

It is more important to be able to estimate the paste mechanical properties directly from measurements of machine parameters, so that the printing equipment can either automatically compensate for variations by modulating the machine parameters, or simply notify an operator of the material property drifts. Thus, the environmental process factors of strain rate, time, temperature, etc., need not be measured or analyzed.

The non-Newtonian and thixotropic behavior of printing media makes a closed form analytical solution impossible for the squeegee/stencil geometry. However, it has been determined that closed loop control can cope with the nonlinear dynamic behavior of the non-Newtonian fluid if certain assumptions and approximations are made about the behavior of the material.

Solder paste flows into stencil apertures due to the hydrodynamic pressure developed at the squeegee tip, by virtue of the squeegee motion. This pressure is the driving force for pumping the paste into stencil apertures. Paste motion is also a function of the paste viscosity, stencil wall roughness, aperture dimension, orientation, and operating conditions. The stencil pattern is known information and nominal wall roughness is dictated by the manufacturing method. These parameters, however, pertain to the microflow of paste into the stencil apertures and are not of great importance here.

Figure 18:
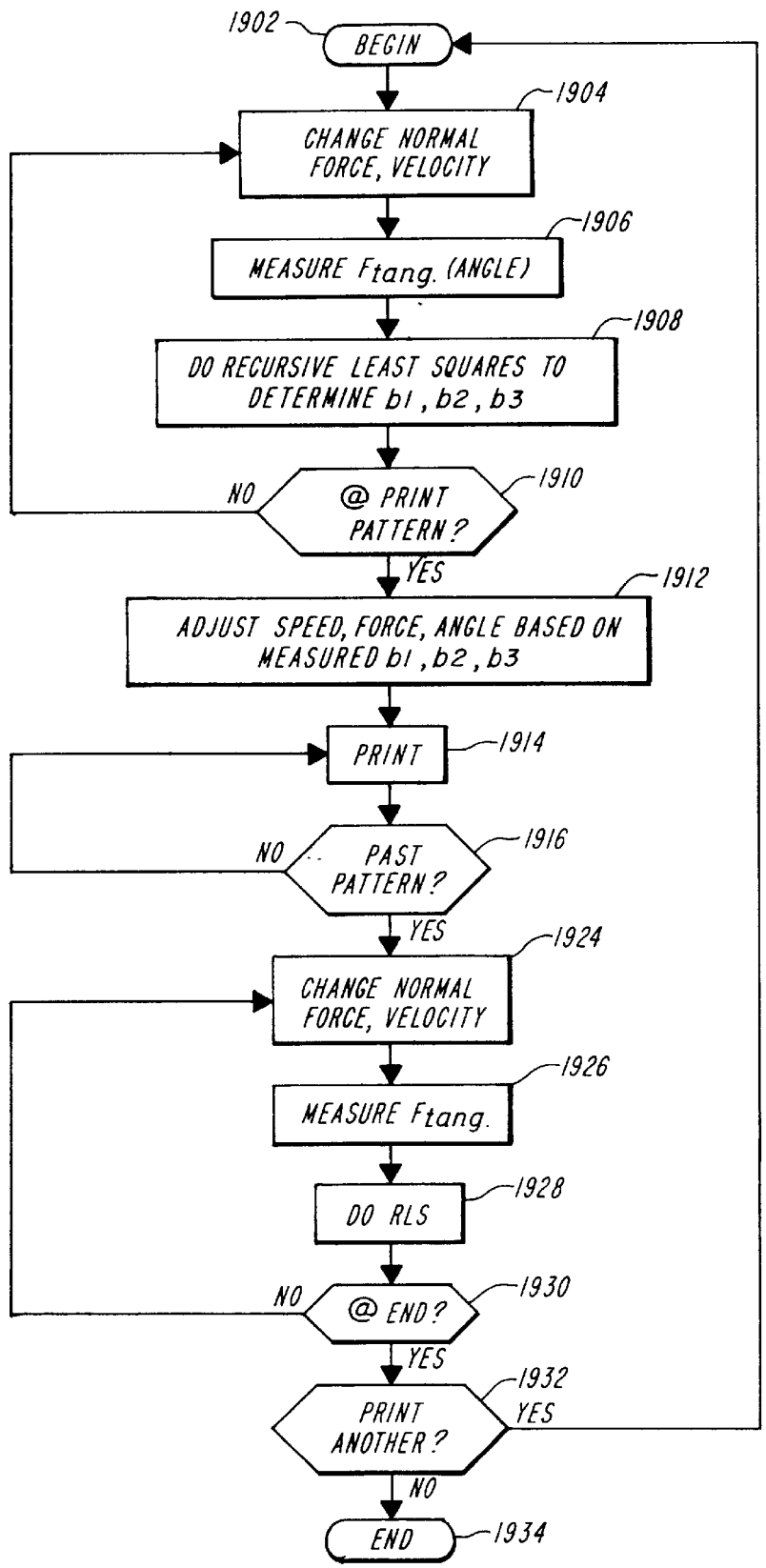
FIG. 18 is a schematic representation in flow chart form of a method of the invention that is based on the assumption that, in the region of interest, the printing medium is Newtonian.

It is important to know how squeegee motion induces a hydrodynamic pressure and how the height of the paste deposited is related to this pressure. Ultimately, if fluid pressure at the squeegee tip can be controlled, in response to changes in paste properties, the paste flowrate into the apertures, and hence the height and uniformity of the deposits, can be controlled. Furthermore since paste properties vary with machine inputs, environmental factors, and time, they must be estimated on-line to achieve superior process control. Control apparatus is illustrated in FIG. 18, in which an in-process parameter estimator 1802 is used for real-time control, possibly in conjunction with ex-situ information acquired from inspection results.

As a first step in understanding this complex process, the gross fluid motion, i.e. the rolling of paste induced by the squeegee, was considered. Signals generated at sensors due to this motion can readily describe mechanical properties of the paste and physical phenomena occurring during the process.

Fluid Mechanics of Printing and Corner Flows Stokes' Flow

Figure 2:
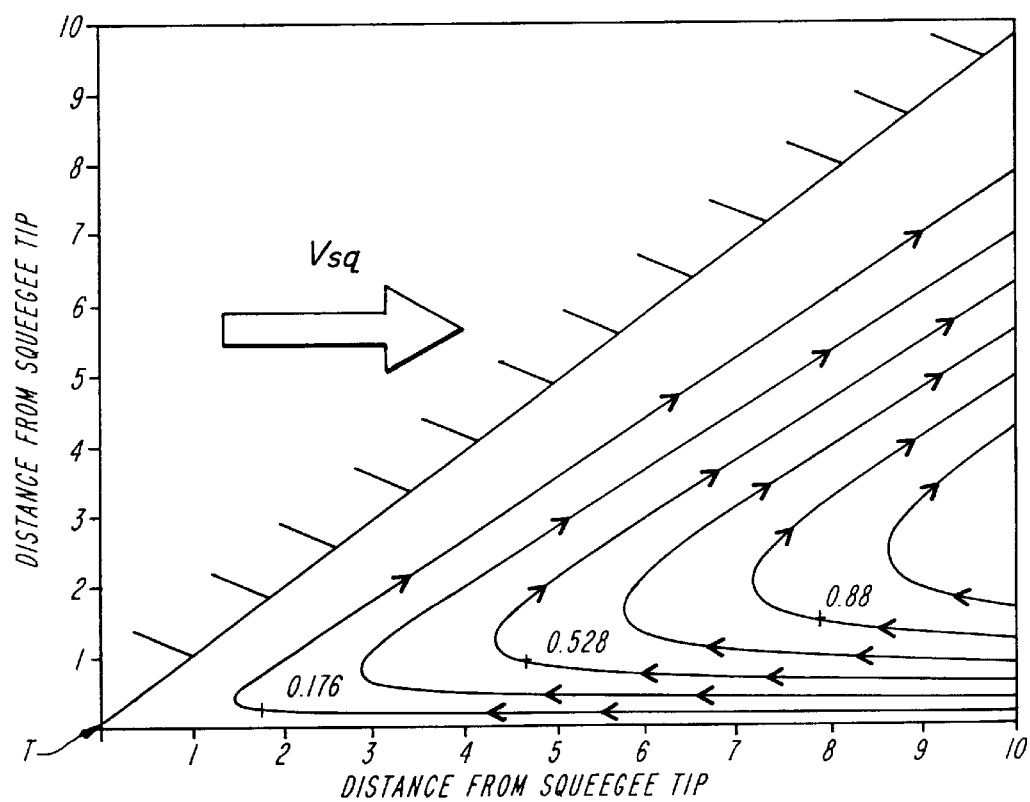
FIG. 2 is a graphical representation showing streamline plot for Taylor's solution for a squeegee angle of $\pi/4$.

It has generally been determined that estimation of the paste motion can be based on the assumption that the flow can be described by the equations pertinent to viscous creeping flow. Furthermore, initially for tractability, the solder paste is considered to be Newtonian, i.e. $\mu$=constant and the fluid body forces can be neglected. (A non-Newtonian analysis is conducted subsequently.) The motion of the paste was constrained to the plane defined by r and $\theta$, as shown in FIG. 2.

Since fluid velocity will be of the same order as squeegee speed, on the order of 1 cm/s, inertial effects of the Navier-Stokes equation, $\rho v \cdot \nabla v$, are negligible compared to the viscous effects, $\mu \nabla^2 v$. For this case, assuming steady state plane polar flow, as shown by G. I. Taylor, "On Scraping Viscous Fluid from a Plane Surface," The Scientific Papers of Sir Geoffrey Ingram Taylor, pp. 410–413, Cambridge University Press, (1971), the fluid motion can be described by the following relations:

$$-\frac{\partial p}{\partial r}+\mu\left[\frac{\partial^2 v_r}{\partial r^2}+\frac{1}{r}\left(\frac{\partial v_r}{\partial r}\right)+\frac{1}{r^2}\left(\frac{\partial^2 v_r}{\partial \theta^2}\right)-\frac{v_r}{r^2}-\frac{2}{r^2}\left(\frac{\partial v_\theta}{\partial \theta}\right)\right]=0 \quad (2)$$

$$-\frac{1}{r}\frac{\partial p}{\partial \theta}+\mu\left[\frac{\partial^2 v_\theta}{\partial r^2}+\frac{1}{r}\left(\frac{\partial v_\theta}{\partial r}\right)+\frac{1}{r^2}\left(\frac{\partial^2 v_r}{\partial \theta^2}\right)-\frac{v_\theta}{r^2}-\frac{2}{r^2}\left(\frac{\partial v_r}{\partial \theta}\right)\right]=0. \quad (3)$$

By introducing the stream function $\psi=\psi(r,\theta)$ such that, $$v_r = -\frac{1}{r}\frac{\partial \psi}{\partial \theta} \quad (4)$$

and $$v_\theta = \frac{\partial \psi}{\partial r}, \quad (5)$$

mass continuity $\nabla \cdot v = 0$ is automatically satisfied. The general equation for steady incompressible creeping flow, often called "Stokes'" flow, can be expressed as a single expression, given by:

$$\nabla^4 \psi(r,\theta)=0. \quad (6)$$

It is necessary to identify a solution to this biharmonic equation that satisfies the nonhomogeneous boundary conditions imposed by the geometry of a moving squeegee over a stencil.

Inside Corner Flow Solution

By the method of separation of variables, a solution to the biharmonic equation (6) can be written as $$\psi=r^\lambda f_\lambda(\theta), \quad (7)$$

where $\lambda$ is any real or complex number and r is the distance from the inside corner (where the squeegee meets the stencil) to the location of interest in the paste. For the viscous creeping solution to be valid, the ratio of the inertial effects, $\rho v \cdot \nabla v$, to viscous effects, $\mu \nabla^2 v$, should be much smaller than one. From the separated variable solution (Equation 7), as shown by H. K. Moffatt, "Viscous and Resistive Eddies Near a Sharp Corner," Journal of Fluid Mechanics, 18, pp. 1–18, (1964), it can be concluded that the inertial term is negligible, provided that $$R = \frac{Ar^{p+1}}{v} \ll 1, \quad (8)$$

where R is the Reynolds number, A is a nondimensional constant, p is $\Re(\lambda-1)$ (the real part of $(\lambda-1)$), and v is the kinematic viscosity, $v=\mu/\rho$. For $\Re(\lambda)<1$, the velocity is unbounded at r=0, hence the inertial forces cannot be ignored as the location of analysis (r) tends towards the squeegee tip. But for $\Re(\lambda)>1$, the inertial forces are negligible as the location of analysis (r) approaches the squeegee tip. (For a discussion of the effects of inertia at a corner, see C. Hancock, E. Lewis and H. K. Moffatt, "Effects of Inertia in Forced Corner Flows," Journal of Fluid Mechanics, 112, pp. 315–327, (1981).) For the problem of flow near an inside corner when a velocity is prescribed on one of the bounding surfaces, it has been suggested by Taylor to use $\lambda=1$. This solution is applicable to the corner flow of solder paste as the squeegee moves along the stencil. For this particular case, the stream function, $\psi(r,\theta)$, is given by, $$\psi(r,\theta)=rV_{sq}(B \sin \theta + C\theta \cos \theta + D\theta \sin \theta). \quad (9)$$

The nonhomogeneous boundary conditions are, $$\psi = 0, \frac{1}{r}\frac{\partial \psi}{\partial \theta} = V_{sq} \text{ at } \theta = 0 \text{(stencil)} \quad (10)$$

$$\psi = 0, \frac{\partial \psi}{\partial \theta} = 0 \text{ at } \theta = \alpha \text{(squeegee)},$$

where a is the angle of inclination between the pushing surface of the squeegee and the horizontal stencil plane. (As shown in FIG. 2, $\alpha=\pi/4$.) The $\psi(r,\theta)=0$ conditions mean that there is no fluid flow relative to the bounding surfaces at the bounding surfaces; and the no-slip condition means that the fluid velocity is zero at the squeegee surface, and $V_{sq}$ at the horizontal plane. With these conditions, Taylor found that the constants B, C, and D are given by:

$$B = \frac{-\alpha^2}{\alpha^2 - \sin^2\alpha}, C = \frac{\sin^2\alpha}{\alpha^2 - \sin^2\alpha}, D = \frac{\alpha - \sin\alpha\cos\alpha}{\alpha^2 - \sin^2\alpha}. \quad (11)$$

FIG. 2 shows the streamlines for a squeegee angle α of π/4, shown schematically in FIG. 1B. (The velocity of the fluid at any given point is tangential to the streamlines.) The fluid moves in the direction of the arrows, with higher velocities existing farther away from both the squeegee and the stencil surface. The squeegee tip is shown at T.

The streamline function is significant because velocity, strain rate, and stress distributions can be determined. Substitution of the expression shown in relation 9 into relations 4 and 5 yields the velocity of the fluid. Substitution of this velocity into relations 2 and 3 yields the stress in the fluid. Furthermore, the stresses can be integrated over the face of the squeegee surface to give the forces acting on the squeegee face. This is significant, because these forces can be measured and used for real-time process monitoring. When an understanding of the situation that accounts for friction and contact forces is applied, the in-situ force measurements can be exploited to describe the hydrodynamics of the paste motion and to provide information relevant to the current state of the mechanical properties of the solder paste.

The r and θ components of the velocity are determined using Equations 9 and 4 and 5:

$$v_r = -V_{sq}(B\cos\theta + C(\cos\theta - \theta\sin\theta) + D(\sin\theta + \theta\cos\theta))$$

$$v_\theta = V_{sq}(B\sin\theta + C\theta\cos\theta + D\theta\sin\theta) \quad (12)$$

The magnitude of the rate of strain, $\dot{\gamma}$, can be determined from the second invariant of the strain rate tensor. For the case of plane polar shear flow, the second invariant of the strain rate tensor is the r, θ shear component of the tensor. Thus, the strain rate is equivalent to the shear rate. The shear/strain rate is given by:

$$\dot{\gamma}_{r\theta} = \dot{\gamma}_{\theta r} = r\frac{\partial}{\partial r}\left(\frac{v_\theta}{r}\right) + \frac{1}{r}\frac{\partial v_r}{\partial \theta}. \quad (13)$$

By direct substitution of the expressions for $v_r$ and $v_\theta$ from Equation 12 into Equation 13, the strain/shear rate for the flow forced around the inside corner is given by:

$$\dot{\gamma}_{r\theta} = \frac{2V_{sq}}{r}(C\sin\theta - D\cos\theta). \quad (14)$$

Since (for the time being) the fluid is being considered to be Newtonian, the shear stress, τ, is proportional to this strain rate and is given by:

$$\tau_{r\theta} = \mu\dot{\gamma}_{r\theta} = \mu\frac{2V_{sq}}{r}(C\sin\theta - D\cos\theta). \quad (15)$$

The pressure distribution is obtained by substitution and integration of the velocities of Equation 12 into Equation 2 and Equation 3, resulting in the relationship:

$$p_r = p_\theta = \mu\frac{2V_{sq}}{r}(D\sin\theta + C\cos\theta). \quad (16)$$

Figure 3:
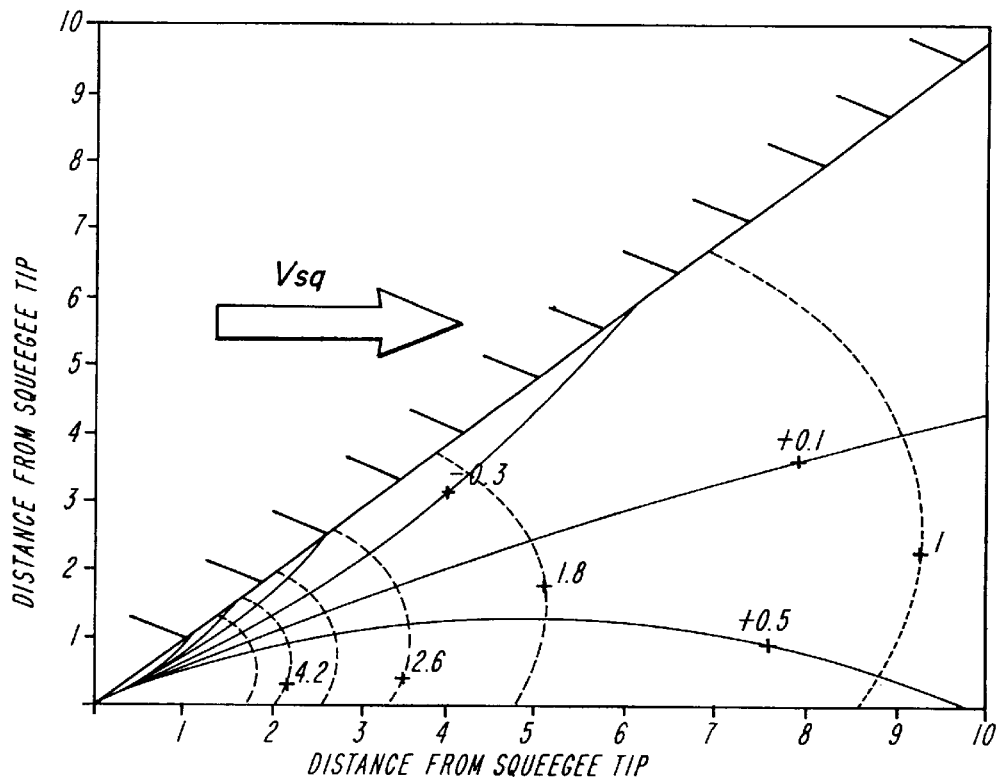
FIG. 3 is a graphical representation showing the lines of constant shear and constant pressure for a squeegee angle of $\pi/4$.

Contours of constant normal stress (broken) and constant shear stress (solid) are shown in FIG. 3 for a squeegee angle of $$\alpha = \frac{\pi}{4}.$$

These curves were generated using unity values for squeegee velocity and viscosity. The normal stress decreases away from the squeegee tip. The shear stress is negative nearest the squeegee surface, is zero inside the paste volume, and is highest near the stencil surface.

As a similarity solution, the above analysis assumes an infinite amount of printing medium in front of the squeegee. An investigation of a finite amount of paste has been conducted by others. In that study, the free surface of the rolling paste was considered. Despite the additional boundary conditions and the free surface of the paste, numerical values of the strain rate (in this case, a shear strain) and pressure are in close agreement with the values obtained by Equations 15 and 16. This accords with Equations 15 and 16, which show that the stresses decrease as $$\frac{1}{r}$$

from the squeegee tip, indicating that occurrences far from the squeegee tip have negligible effect. This suggests that the volume of paste in front of the squeegee has little effect on the hydrodynamic pressures of interest.

Squeegee Mechanics

Figure 5A:
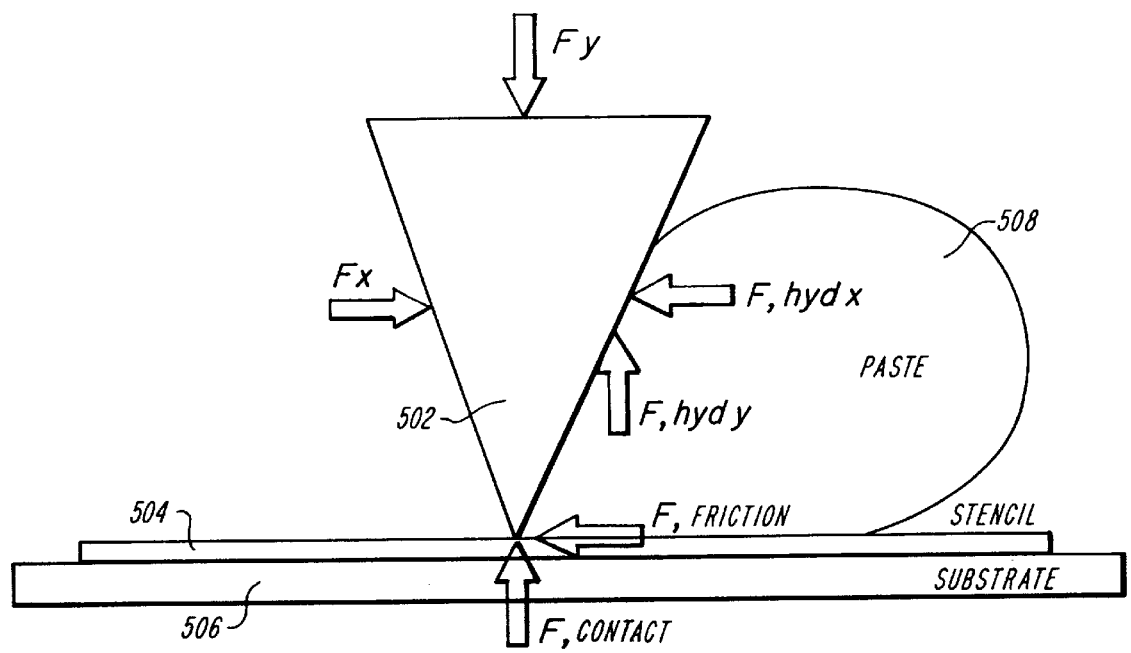
FIG. 5A is a schematic representation of the forces acting on a squeegee during a normal printing operation.

The foregoing addresses identifying the stress distribution generated within the solder paste during printing due to hydrodynamic phenomena. The following extends the consideration of the mechanics of solder paste flow, and applies the results obtained above to a set of assumptions that take into account additional forces (friction and contact forces) acting on the squeegee during printing. By including friction and contact forces, the connection is made between the fluid dynamics of flow around an inside corner and in-situ measurements of machine parameters for process monitoring. By contact force, it is meant the force between the squeegee and the stencil normal to the stencil, as shown in FIG. 5A.

Squeegee Forces

By evaluating the stresses along the squeegee face, θ=α, the stresses per unit length in the z direction (FIG. 1) can be resolved in convenient directions, and integrated to yield the hydrodynamic forces on the squeegee generated by the paste motion. For convenience, the stress $p_r$ (expressed in relation 16) is resolved in the x and y directions as defined in FIG. 1:

$$p_x = \frac{2\mu V_{sq}}{r}\left(\frac{\sin^2\alpha}{\alpha^2 - \sin^2\alpha}\right) \quad (17)$$

$$p_y = \frac{2\mu V_{sq}}{r}\left(\frac{\alpha - \sin\alpha\cos\alpha}{\alpha^2 - \sin^2\alpha}\right). \quad (18)$$

Figure 4:
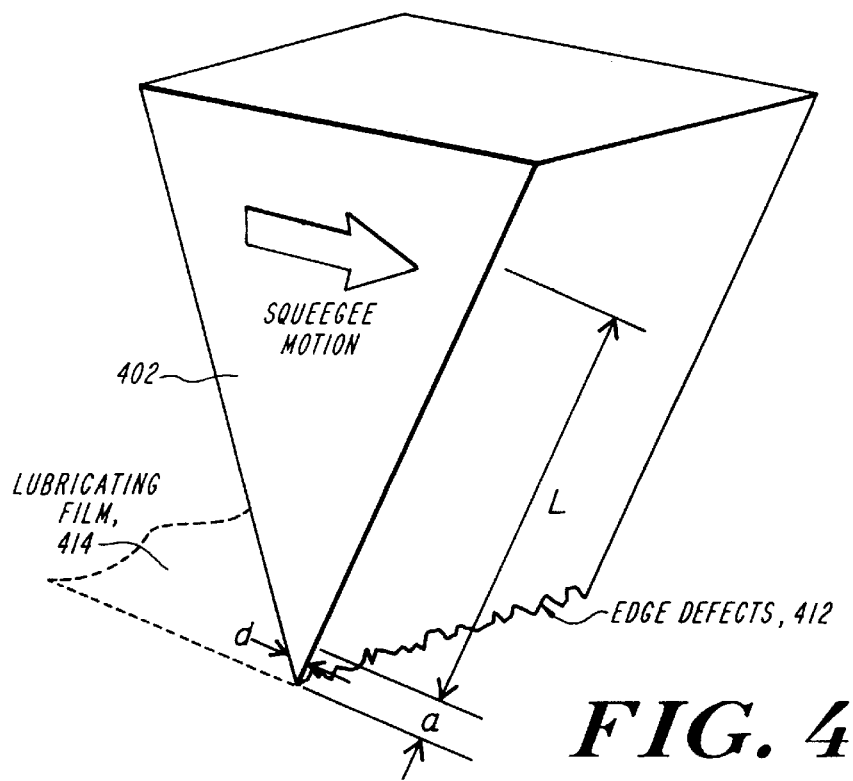
FIG. 4 is a schematic representation of thin film lubrication during between the squeegee tip and the stencil printing.
Figure 5B:
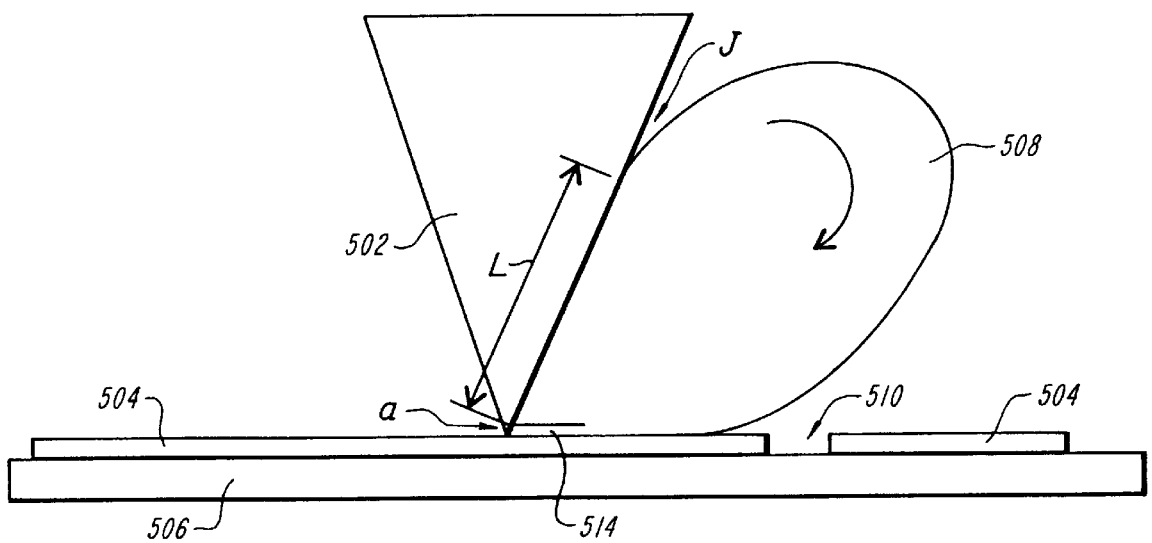
FIG. 5B is a schematic representation of a rolling bead of solder paste during a normal printing operation.

To obtain the hydrodynamic forces acting on the squeegee, these stresses must be integrated over the area of fluid contact. Unfortunately, the analytical singularity at the squeegee, r=0, causes the expression for the forces to indicate an unbounded force. However, the analytical tools describe an ideal wedge. A more realistic analysis takes into account that analytical tools do not apply at the inside corner at the squeegee/stencil interface at the very spot where the two meet. Rather, the analytical tools apply only over a region that begins some characteristic distance "a" away from the ideal point of intersection, and extends outward. The size of "a" is the characteristic size of any edge defects 412 or the thickness of a lubrication film layer 414 as shown in FIG. 4. The lubricating film consists of flux binder, while the bulk flow of paste particles and its constituents are still governed by the Taylor solution. The presence of lubrication does not disturb the fluid pattern predicted by the streamline function, but rather is used as a conceptual tool to understand what actually happens, rather than being bound by the unrealistic case of infinite fluid forces at the squeegee tip, which is known from experience not to occur. The fluid stresses of Equations 17 and 18, can be integrated from this characteristic length, denoted by a, (rather than from zero) to the point J where the solder paste 508 separates from the face of the squeegee 502 and rolls, a distance L. This is shown schematically in FIG. 5B. The integration yields the hydrodynamic forces per unit length (in the z direction) in the x and y directions:

$$F_{hyd_x} = \int_a^L p_x \, dr \quad (19)$$
$$= 2\mu V_{sq}\left(\frac{\sin^2\alpha}{\alpha^2 - \sin^2\alpha}\right)\ln\left(\frac{L}{a}\right)$$

$$F_{hyd_y} = \int_a^L p_y \, dr \quad (20)$$
$$= 2\mu V_{sq}\left(\frac{\alpha - \sin\alpha\cos\alpha}{\alpha^2 - \sin^2\alpha}\right)\ln\left(\frac{L}{a}\right).$$

The term, $$\ln\left(\frac{L}{a}\right),$$

which arises due to integration, is significant, because it suggests that the volume of paste has negligible effect on the forces generated by the paste motion. Since L is so much larger than a, variations in L do not greatly change the $$\ln\left(\frac{L}{a}\right).$$

Figure 5C:
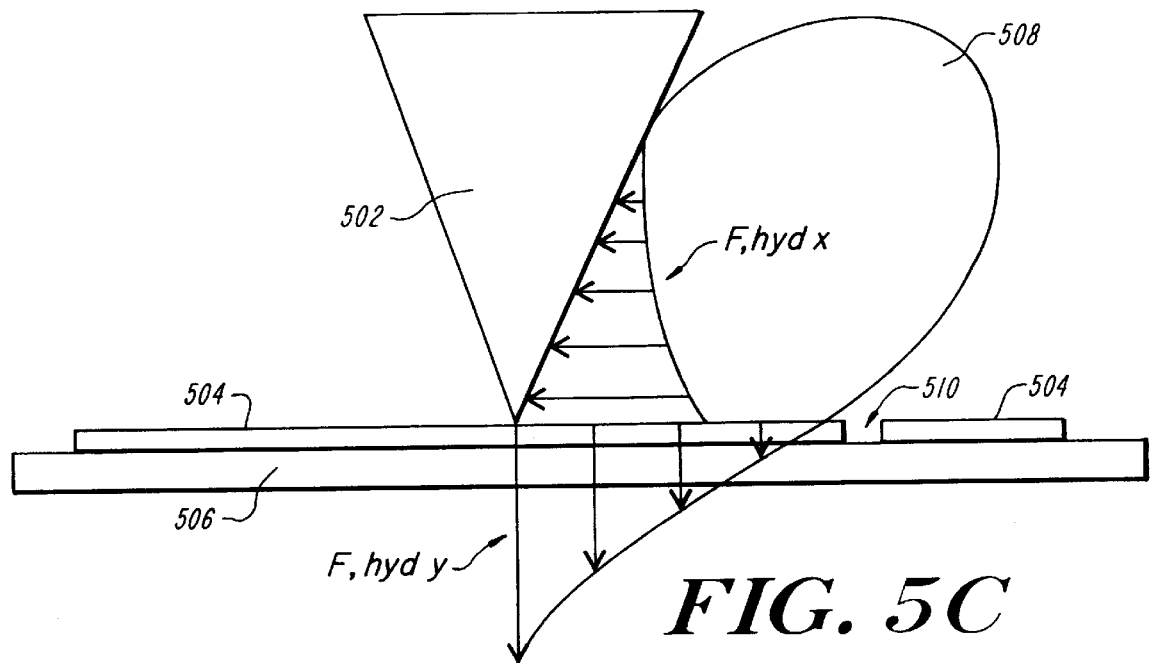
FIG. 5C is a schematic representation of the hydrodynamic stresses applied to the squeegee face and stencil surface during a normal solder paste printing operation.

These force profiles are shown schematically in FIG. 5C where it can be seen that the forces far from the squeegee tip are very small. By considering $$F_{hyd} \propto \ln\left(\frac{L}{a}\right),$$

the change in force due to a change in the volume of paste can be written as:

$$\Delta F(L/a) = \frac{\partial F}{\partial (L/a)}\Delta\left(\frac{L}{a}\right) = \frac{a}{L}\Delta\left(\frac{L}{a}\right). \quad (21)$$

since a is a characteristic size of the lubricating film 514 flux or squeegee edge defects, on the order of $\mu$m, the ratio a/L<<1. The negligible effect of volume on the fluid forces agrees with the numerical results obtained by T. F. Hanrahan, P. F. Monaghan and R. D. Babikian, "Modeling of a Solder Paste Flow with a Free Surface in Stencil Printing," ASME/JSME Conference on Electronics Packaging, pp. 587–592, (1992). The consequence of this volume relationship is that the fluid properties can be estimated on-line without precise knowledge of solder volume.

The effect of friction and contact forces must also be considered, as illustrated in FIG. 5A. A traditional force balance for this system establishes the following relationships, $$F_x = F_{friction} + F_{hyd_x} \quad (22)$$

$$F_y = F_{contact} + F_{hyd_y} \quad (23)$$

where $F_{hyd_x}$ and $F_{hyd_y}$ are given by Equations 19 and 20 and the frictional force is approximated as:

$$F_{friction} = \eta F_{contact}. \quad (24)$$

By substitution and rearrangement of terms, the following expression is obtained for the total force acting in the x direction opposing squeegee motion.

$$F_x = \eta(F_y - F_{hyd_y}) + F_{hyd_x}. \quad (25)$$

By grouping terms and using the previously derived expressions (Equations 19 and 20) for the hydrodynamic forces, $F_x$ can be written as:

$$F_x = a_1 V_{sq} f_1(\alpha) + a_2 V_{sq} f_2(\alpha) + a_3 F_y, \quad (26)$$

where $a_1 = 2\mu \ln(L/a)$, $a_2 = -2\eta\mu\ln(L/a)$, $a_3 = \eta$ and $f_1(\alpha)$ and $f_2(\alpha)$ are the nonlinear, trigonometric functions appearing in the equations for the hydrodynamic stresses. For simplicity, the squeegee angle $\alpha$ is considered to be fixed at 45°. For a constant, known angle of inclination, the expressions in Equation 25 and Equation 26 can further be rearranged. If the fluid is considered to be Newtonian, and thus the viscosity is a simple constant, the force in the x direction can be expressed by $$F_x = b_1 V_{sq} + b_2 F_y + b_3, \quad (27)$$

where $b_1 = a_1 f_1(\alpha) + a_2 f_2(\alpha)$, $b_2 = a_3$, and $b_3$ is a term that is added to acknowledge the fact that the fluid is not really Newtonian.

Figure 7A:
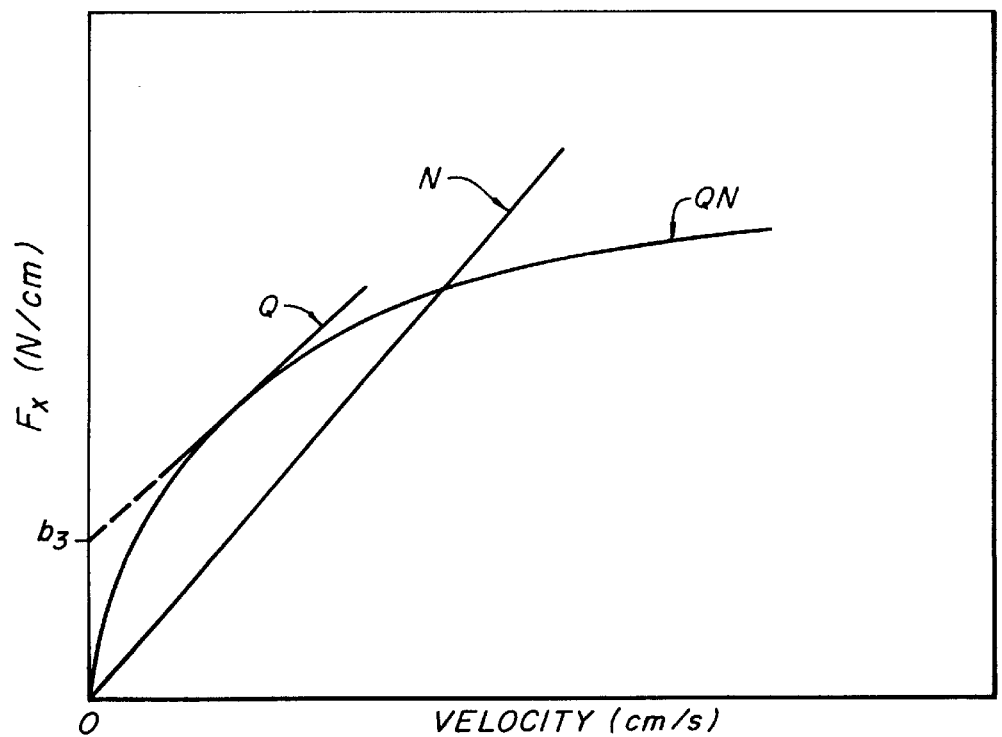
FIG. 7 is a graphical representation of force vs. squeegee velocity, for the force in the x direction, which shows the non-Newtonian characteristics of the solder paste.

If one were to graph the relation between force and the velocity of the squeegee, as shown in FIG. 7A, a Newtonian fluid shows the relation set forth by curve N. (The classic definition of a Newtonian fluid is stated in terms of the relation between the stress and the strain rate. Those properties cannot be conveniently measured in the present context. However, stress is related to the force in the x direction and strain rate is related to squeegee velocity, such that it is equivalent to examine the Newtonian characteristics of the fluid by examining the relationship between this force and velocity.) However, it may be the case that a fluid will exhibit approximately Newtonian characteristics over a region of squeegee velocity, as shown by curve QN, having a tangential line Q, which approximates the curve QN itself. The line Q defines a constant of proportionality (its slope) relating the force to the velocity. As can be seen, an extension of the line Q intercepts the $F_x$ axis at $b_3$, as $b_3$ is used in Equation 27.

This "phantom" intercept is a consequence of the nonlinear behavior of the actual solder paste. For a true Newtonian fluid, $b_3=0$. Over an operating range where the linear approximation is valid, the nonzero phantom intercept term could be interpreted as a yield point of the paste, while the slope of the line could be considered as the fluid viscosity. (The yield point is the minimum value of the applied stress which causes the fluid to flow.)

This result is very useful. All of the machine parameters that are necessary to measure paste and squeegee/stencil mechanical properties can themselves be measured. These are: angle of inclination, squeegee speed, and normal and tangential (to the stencil) forces applied. These machine parameters are linearly related to each other by "linking" parameters $b_1$, $b_2$, $b_3$ that are relevant to the paste and squeegee/stencil properties. By measuring the forces acting on the squeegee in the x (tangential) and y (normal) directions, the squeegee angle and applying the foregoing relations and estimation techniques, the values of the $b_1$, $b_2$ and $b_3$ parameters in Equation 27 can be measured in real time.

If the fluid exhibits Newtonian behavior, the viscosity $\mu$ is constant and the relations in Equations 26 or 27 are linear in $V_{sq}$. This is beneficial since parameter estimation techniques for linear systems rapidly converge, making their implementation in an on-line environment ideal. Since, the relationship in Equation 27 is linear in its coefficients, and any significant variation in the linking parameters $b_{1,2,3}$ occur over a long time scale, standard parameter estimation techniques are appropriate for on-line estimation of mechanical material properties. With application of this technique, mechanical solder paste properties and system properties due to both tool and paste properties, such as coefficient of friction, can be estimated in real time and can track any variations to these parameters independently. If the fluid does not exhibit consistent Newtonian behavior, the foregoing relations can also be used in conjunction with the apparatus of the invention to track the parameters of interest. However, additional steps must be used.

Apparatus

Figure 6A:
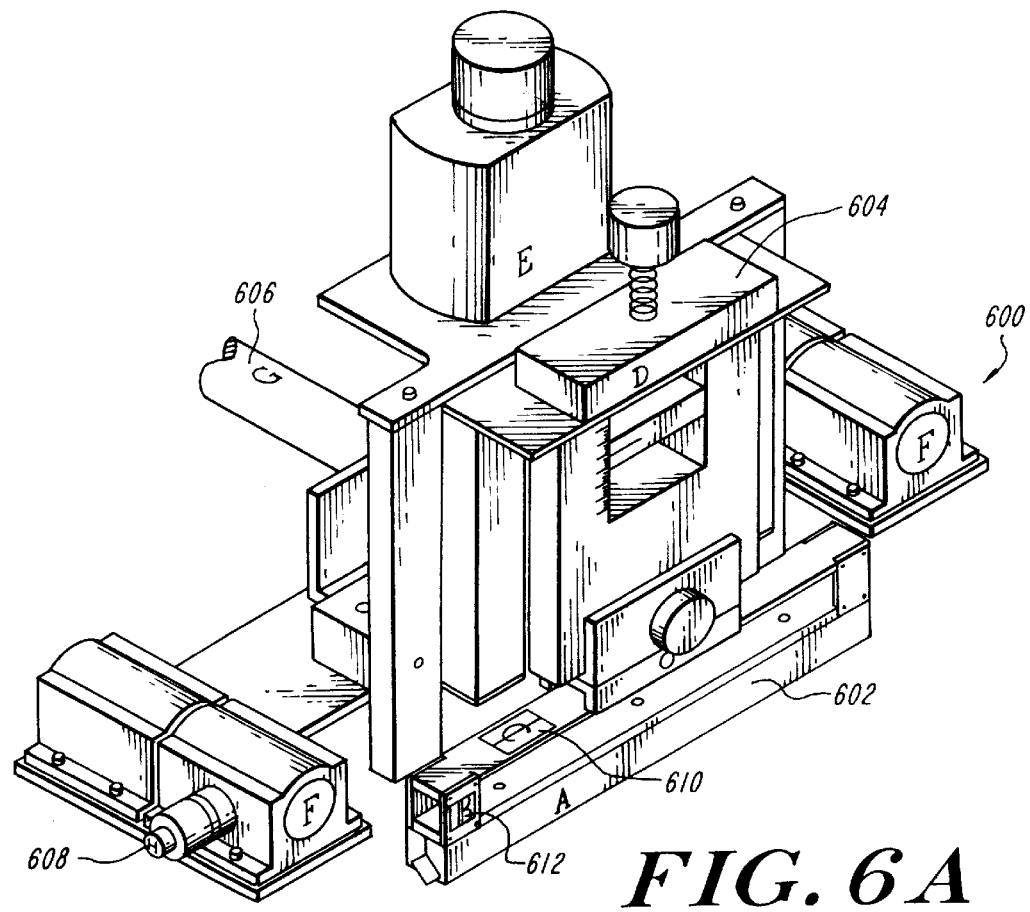
FIG. 6A is a perspective view of a print head assembly used for applying solder paste for SMDs, equipped with a rotary potentiometer and strain gauges.

Determination of the linking parameters requires measurement of squeegee forces. An apparatus of the invention suitable for this purpose is shown schematically with reference to FIG. 6A. A two degree-of-freedom force sensor was placed on the squeegee assembly of a semi-automatic paste printer 600 such as is sold by MPM of 20 Forge Park, Franklin, Mass., under trade designation MPM SP200. The printer has a squeegee 602 and a spring load 604, which applies a downward force on the squeegee 602 normal to the stencil (not shown). The squeegee is advanced by a ram 606 controlled by apparatus that is not shown, such as a compressed air device. A rotary potentiometer encoder 608 generates signals that measure the speed $V_{sq}$ at which the squeegee advances. A y-direction strain gauge assembly 610 is mounted on the squeegee 602 in such a way as to measure normal force $F_y$ in the y-direction. An x-direction strain gauge assembly 612 is mounted on the squeegee 602 in such a way as to measure tangential force $F_x$ on the squeegee in the x-direction. ("Normal" and "tangential" are relative to the squeegee. The forces $F_y$ and $F_x$ are sometimes referred to herein, and in the attached drawings and claims as $F_{tang}$. and $F_{normal}$, respectively.) The strain gauges are 120Ω±0.15% resistance gauges with a gauge factor of f=2, sold by Micro Measurements of Pittsburgh, Pa. The squeegee angle was fixed at 45°.

Figure 6B:
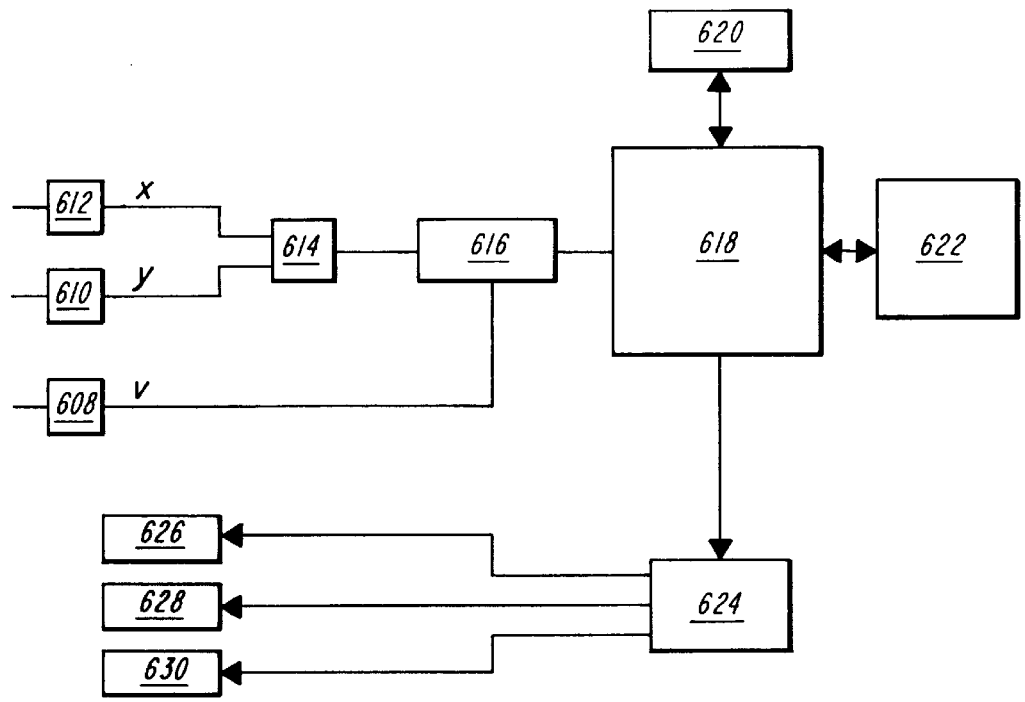
FIG. 6B is a schematic representation in block diagram form of an embodiment of the invention showing the arrangement of sensors and analysis apparatus.

FIG. 6B shows, in block diagram form, how the various sensors are connected to signal processing apparatus. The strain gauges 610 and 612 at both locations are arranged in a full bridge pattern to eliminate temperature effects, and the signals are filtered and amplified using low noise, low bias current instrumentation amplifiers 614 shown in FIG. 6B. The signals are collected using a Dell 386 general purpose digital IBM PC compatible computer 618 equipped with a National Instruments AT-MIO-16 data acquisition board 616 and appropriate memory 620 and input/output devices 622. Additional circuitry includes various relays and digital triggers to actuate the print cycle and to begin and end data collection automatically. The computer may be running an appropriate operating system, such as DOS or UNIX. A digital to analog converter 624 connects the signal processor 618 to actuators for the squeegee motor, angle and contact force 626, 628, 629.

Consideration of the Degree of Newtonian Behavior

For the theoretical analysis discussed above, it was also assumed that the fluid was Newtonian and that the frictional force was negligible.

One test measured independently the importance of the normal force $F_y$ on $F_x$. The test showed that, for $F_y$ ranging from 10 to 20 lbs-f (a typical range), $F_x$ did not vary significantly, indicating that the friction force in the x direction ($\eta F_{contact}$) is negligible compared to the hydrodynamic force $F_{hyd}$ generated by squeegee motion. A constant squeegee speed was used for these tests to ensure that the hydrodynamic fluid forces would remain constant. The results were consistent with the assumption that avoids the singularity in obtaining the hydrodynamic forces, that a thin film 514 of binder lubricates the stencil 504, hence decreasing any friction considerably. (See FIGS. 4 and 5B.) This should not suggest that force measurements in the y direction are unimportant, since this information is still required for closed loop control of squeegee downward force. However, it does suggest that the contribution of the friction force shown in FIG. 5A is minimal.

Figure 7B:
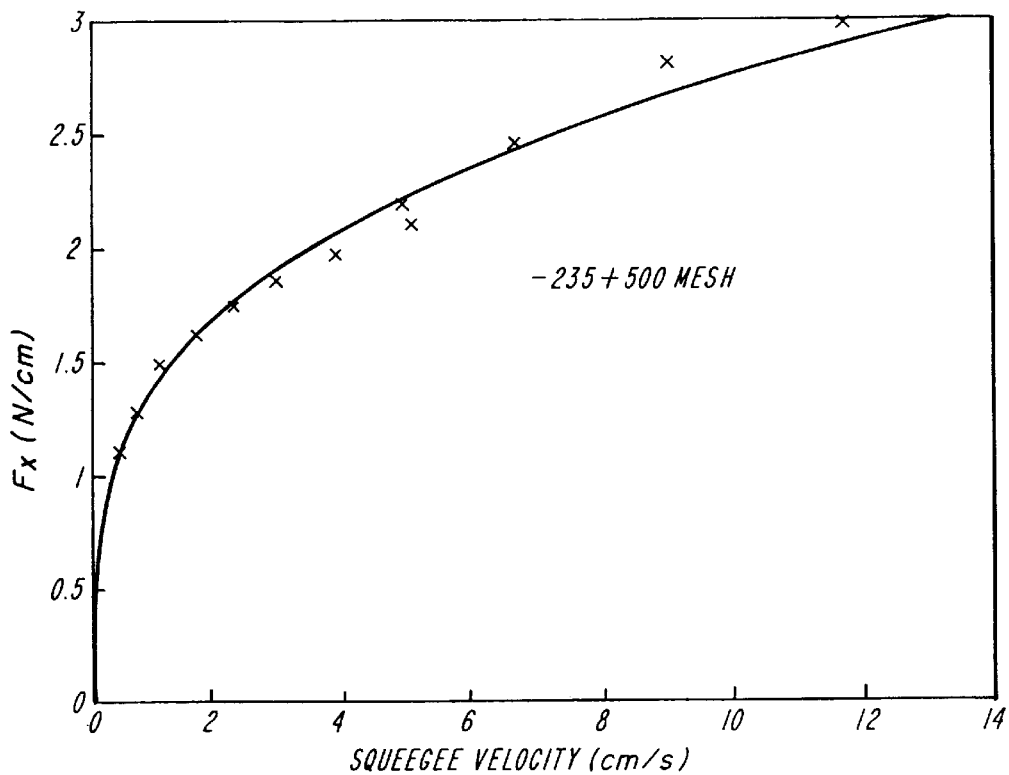

Another test evaluated the Newtonian assumption. The average x component of force $F_x$, was measured as a function of the squeegee velocity $V_{sq}$ for an entire print pass to test this assumption. If the solder paste could be described as a Newtonian fluid, $F_x$ would be directly proportional to the squeegee speed, $V_{sq}$ as shown by the straight line N in FIG. 7A. (This is because $F_x$ is proportional to the fluid stress in that direction, (if there is no friction) and $V_{sq}$ is directly proportional to the strain rate (Equation 14).) That is, for all strain rates encountered in this type of flow, the constant of proportionality would be the viscosity of the fluid and the viscosity would be constant over all $V_{sq}$ ranges. The measured force/speed behavior for a typical solder paste is shown in FIG. 7B. Each point in FIG. 7 plot is the average force at a specified velocity for an entire printing pass.

The measured force/velocity behavior is not Newtonian, but rather displays the nonlinear behavior of strain rate for a power law fluid. Since the force measurements are, in essence capturing the strain rates distributed throughout the paste volume, the distributed "viscosity" (based on many different rates of strain throughout the volume of the fluid) of the fluid measured using this technique at slower squeegee speeds is larger than the distributed viscosity of the fluid measured using this technique at higher speeds. Furthermore, because it has been established that the pressures at the squeegee tip dominate the measurements, the viscosity of the fluid within this region of highest shear rates has a high contribution to the force measurements.

Although the relationship is not linear over all speeds, the force/velocity behavior is relatively constant over the working range $$\left(3 \text{ to } 9 \frac{cm}{s}\right)$$

of most production machines in production. Thus, for the ranges of strain rates generated by the squeegee motion in this speed region, the fluid can be characterized by a constant of proportionality. Even if the working range of squeegee speeds were to include regions with more pronounced non-Newtonian behavior, multiple, piecewise linear approximations could still yield useful results.

Figure 8:
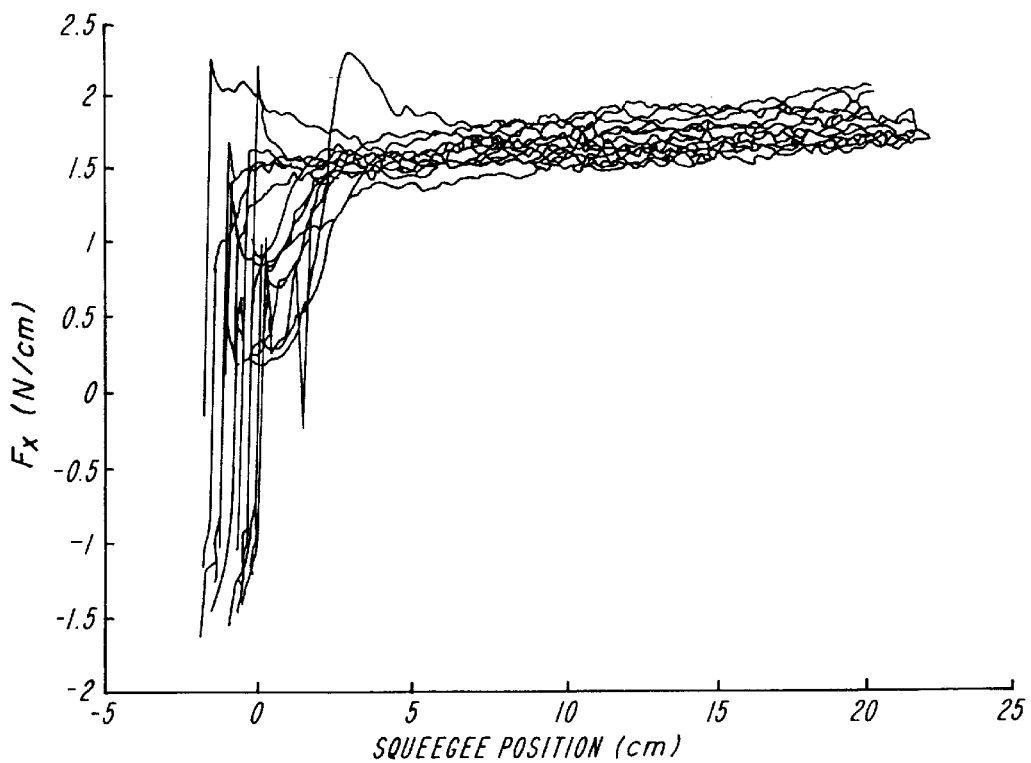
FIG. 8 is a graphical representation of the force in the x direction vs. squeegee position for approximately 20 print passes.
Figure 9:
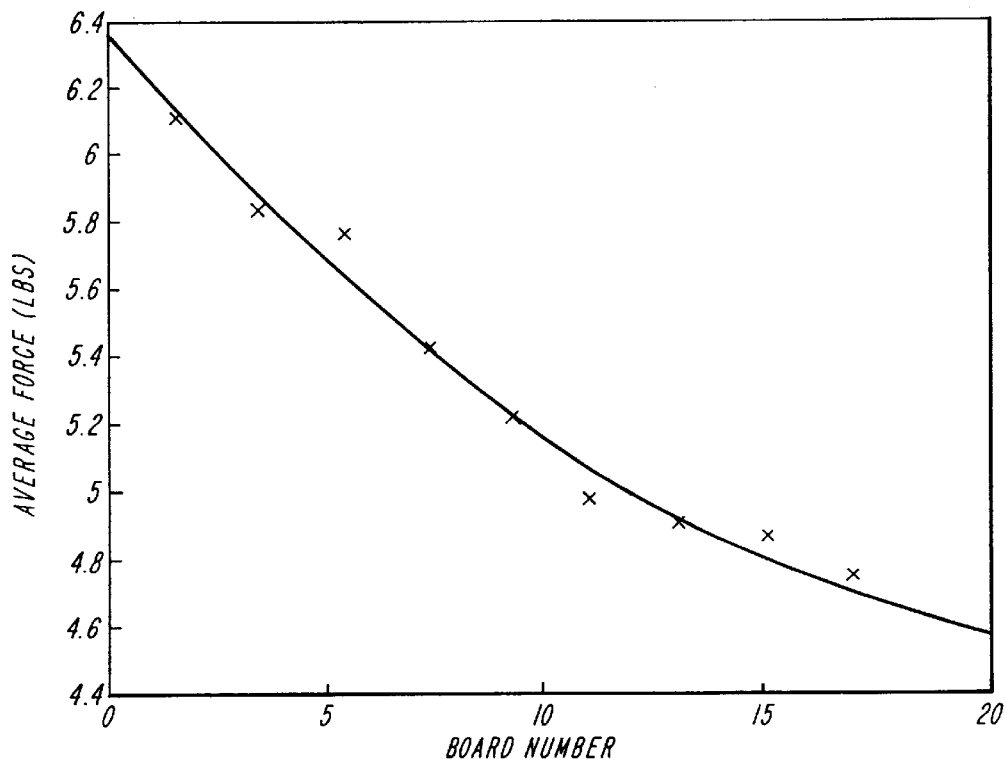
FIG. 9 is a graphical representation of the average force in the x direction vs. the number of the print pass, for the cycles shown in FIG. 8.

Another test confirmed that the force sensors are sensitive enough to detect changes of the paste properties due to shear thinning and solvent evaporation if on-line material monitoring is to be useful. The thixotropic behavior was observed during operation of the printing machine over a long duration, as shown in FIG. 8. Despite the noise of the force sensor readings, shear thinning was observed. Each line in FIG. 8 represents one print pass. For twenty prints, the measured force in the x direction, $F_x$, decreased by approximately fifteen percent. Average force values from FIG. 8 versus print pass number are shown in FIG. 9.

An Empirically Derived Non-Newtonian Estimator

The experiments discussed above validate many of the assumptions incorporated into the Newtonian analysis for the fluid motion and squeegee forces identified above. The friction force is negligible due to thin film lubrication. Paste volume does not contribute to measured forces, and the force sensors have sufficient resolution to observe changes in paste viscosity over time. However, non-Newtonian behavior of the paste was observed in the experiments that measured the force/velocity characteristics. Although a linear approximation is valid for certain, often critical ranges of squeegee speed, a nonlinear power law approximation is also useful and may be more appropriate in some circumstances.

Another aspect of the invention uses such non-linear considerations, which have been developed based on the empirical results. The force/velocity measurements shown in FIG. 7B can be fitted with a curve of the form $$F_x = kV_{sq}{}^n. \tag{27.5}$$

Assuming that the fluid forces generated by the squeegee motion can be described by a power law relation, the linear relation given by Equation 26 developed under linear assumptions can be modified and written in the form:

$$F_x = a_1 V_{sq}{}^n f_1(\alpha) + a_2 V_{sq}{}^n f_2(\alpha) + a_3 F_y. \tag{28}$$

The primed parameters $a_i'$ are the same as the unprimed parameters $a_i$ of the linear approximation, except that the linear assumption viscosity $\mu$ is replaced by the constant k, which is representative of the thickness of the fluid. Thus, $$a_1' = 2k\ln\left(\frac{L}{a}\right), \quad a_2' = -2\eta k\ln\left(\frac{L}{a}\right), \quad \text{and} \quad a_3' = \eta.$$

The trigonometric functions $f_1(\alpha)$ and $f_2(\alpha)$ remain the same. As before, by grouping the $f_i(\alpha)$ terms, the non-Newtonian situation described by Equation 28 can be rewritten as, $$F_x = b_1' V_{sq}'{}^{4} + b_2' F_y \tag{29}$$

where $b_1' = a_1' f_1(\alpha) + a_2' f_2(\alpha)$, $b_4' = n$, and $b_2' = a_3'$. (There is no primed analog to the linear assumption parameter $b_3$, because that was an approximation due to the non-Newtonian nature of the fluid. Here, where that non-Newtonian nature is more explicitly acknowledged in the power law relation by the exponent $b_4'$, there is no need for the $b_3$ term, which signified a "phantom" intercept.) Thus, $b_1'$ is proportional to the thickness k, by the factor of $$2\ln\left(\frac{L}{a}\right)f_1(\alpha) - 2\eta\ln\left(\frac{L}{a}\right)f_2(\alpha).$$

Both the Newtonian and non-Newtonian assumptions are useful. Measurable signals are related to machine parameters and other quantities, which have physical significance. When the application of the apparatus can tolerate results based on a linear approximation, certain parameter estimation techniques can be applied, as shown immediately following. When the application requires more precise results, different techniques are used.

Estimation Technique and Results

For the linear approximation situation, a recursive least squares technique is directly applied to obtain estimates, while for the nonlinear approximation situation, some algebraic manipulation is required first to recast the relations in linear form, to which the recursive least squares technique can be applied. In the following section, the estimation techniques are described, and experimental results of the parameter estimation for the linear and nonlinear approximation are presented.

Recursive Least Squares Estimation

For systems in which the application can tolerate results based on an approximation that measurable and other known quantities are linearly related by the linking parameters, $b_i$, the well known least squares method provides the optimal solution for linking parameter estimation. Using this method, the unknown $b_i$ linking parameters are estimated such that the square of the error between the actual system output y(t) (measured associations of machine parameters), and estimated system output ŷ(t), a mathematical relation among machine parameters, is a minimum.

The notation frequently used would express Equation 27 in the form, $$y(t) = \phi_1(t)\theta_1 + \phi_2(t)\theta_2 + \ldots + \phi_n(t)\theta_n = \phi(t)^T\theta, \tag{30}$$

where y(t) is the measured machine parameter at time t, $\phi_n$ are referred to as regressors, and $\theta_n$ are unknown factors to estimate. For the linear approximation of the printing operation given by Equation 27, y(t)=$F_x$, $\phi_{1,2,3}$=$V_{sq}$, $F_y$, and 1, and the unknown parameters $\theta_i$=$b_i$, the linking parameters. The least squares technique can be extended to recursive computations. A benefit of the recursive method is rapid convergence, an essential requirement if any system is to implement the estimation scheme on-line.

In this case, the machine parameters are measured for at least three associations or triplets of the three machine parameters $F_x$, $V_{sq}$ and $F_y$. These first three associations define a plane in $F_x$, $V_{sq}$, $F_y$ space. As additional machine parameters are measured and associated in triplet sets of $F_x$, $V_{sq}$ and $F_y$ values, the least square method is used to identify the plane that best relates the values measured for $F_x$, $V_{sq}$ and $F_y$ to each other. The plane identifies the linking parameters $b_i$. Thus, measurements associate values of parameters together and application of the least squares technique identifies a relation that shows agreement with all of the measured associations of machine parameters within a predetermined level of accuracy. Identification of the relation also identifies the linking parameters.

Since the thixotropic viscosity behavior of solder paste is characterized by a long time constant relative to the sampling time of the measuring apparatus, a recursive estimation technique which exponentially windows signals is an appropriate choice for on-line monitoring of the printing operation.

An error function is defined by, $$V(\theta, t) = \frac{1}{2}\sum_{i=1}^{t} \lambda^{t-i}\epsilon(i)^2, \qquad (31)$$

where $\lambda$ is a forgetting factor and $0<\lambda\leq 1$. For this error function to be minimized, the following relations must exist:

$$\hat{\theta}(t) = \hat{\theta}(t-1) + K(t)\left(y(t) - \phi^T(t)\hat{\theta}(t-1)\right); \qquad (32)$$

$$K(t) = P(t)\phi(t) = P(t-1)\phi(t)(\lambda I + \phi^T P(t-1)\phi(t))^{-1}; \text{ and} \qquad (33)$$

$$P(t) = \frac{(I - K(t)\phi^T(t))P(t-1)}{\lambda}. \qquad (34)$$

An initial covariance matrix P0 is chosen to represent the initial uncertainty in the parameters $\theta_i$. This matrix must be positive definite and usually is chosen with large initial diagonal entries. At time step (t+1), the estimated parameters $\hat{\theta}$(t+1), and covariance matrix P(t+1) are updated.

Results During Printing

The recursive least squares techniques with exponential forgetting was implemented for estimation of the unknown linking parameters for both the linear approximation of Equation 27 and the nonlinear approximation, described in Equation 29, using signals collected during the printing operation.

Newtonian Approximation Estimation

Figure 10:
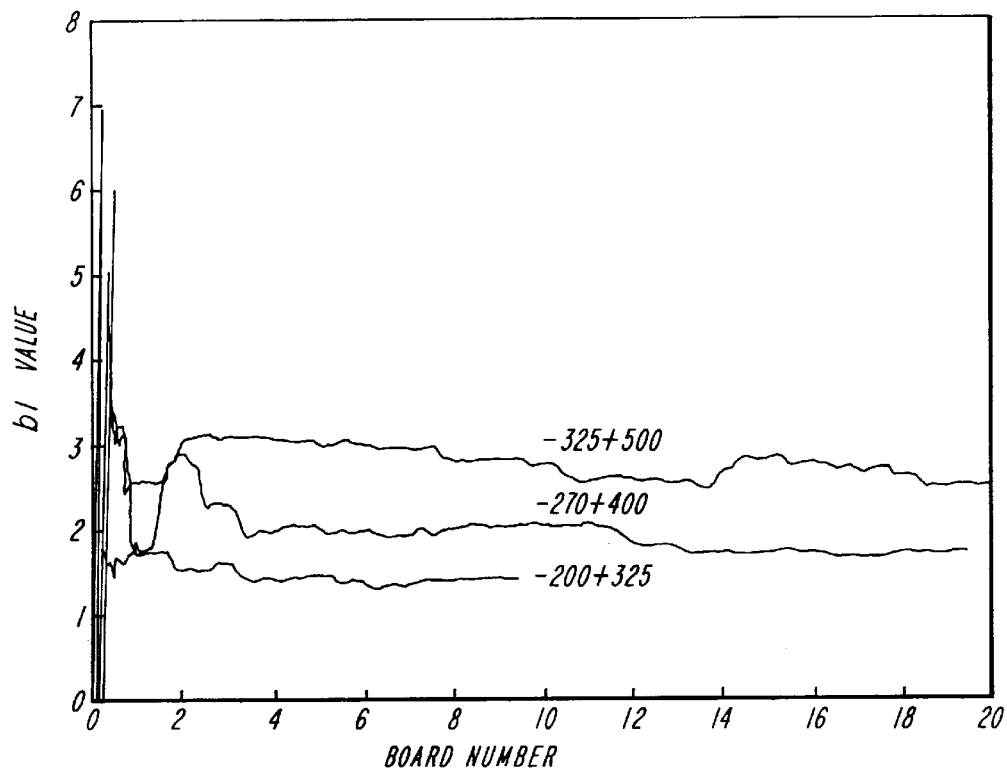
FIG. 10 is a graphical representation showing the estimate for linking parameter $b_1$ for three solder pastes, comparing the parameter value to the printing pass.
Figure 11:
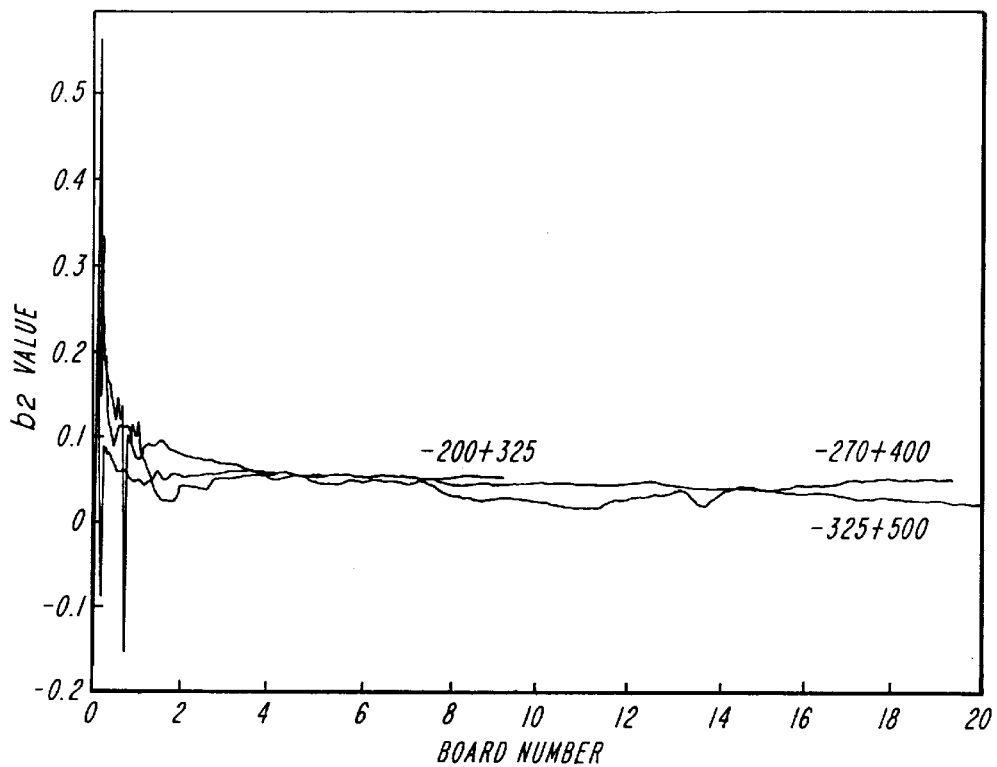
FIG. 11 is a graphical representation showing the estimate for linking parameter $b_2$ for three solder pastes, comparing the parameter value to the printing pass.
Figure 12:
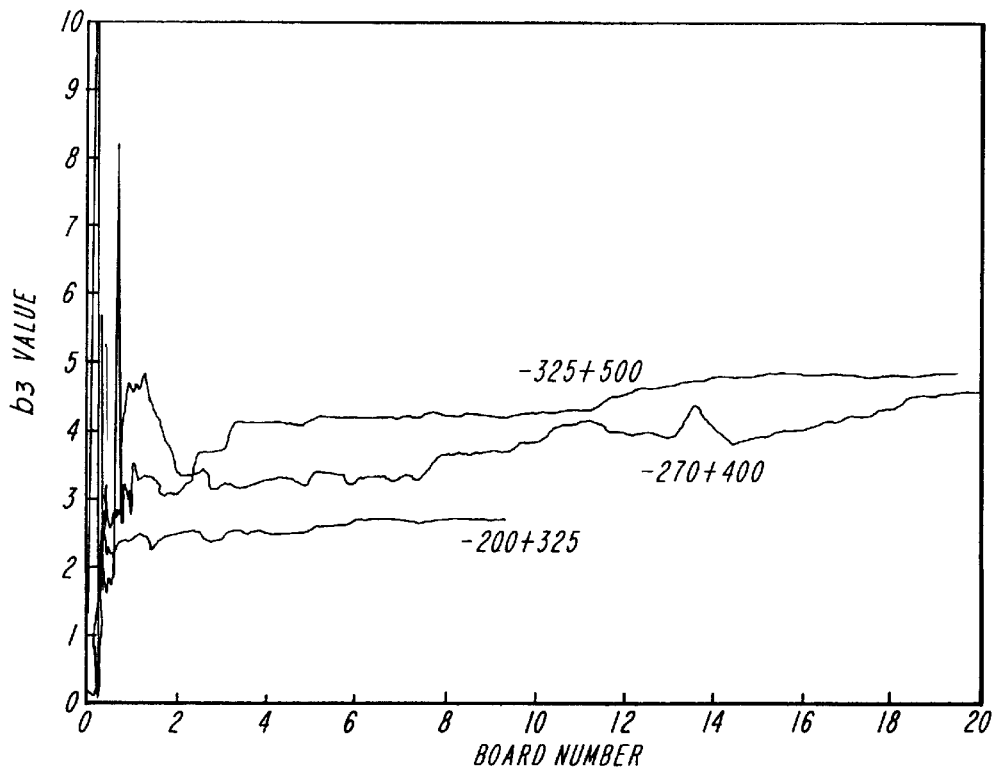
FIG. 12 is a graphical representation showing the estimate for linking parameter $b_3$ for three solder pastes, comparing the parameter value to the printing pass.

The results of the parameter estimations for three different solder pastes are shown in FIGS. 10 through 12, using the Newtonian linear approximation described by Equation 27. The machine parameters were measured during the printing passes of twenty printed circuit boards. Single direction printing was used in all tests.

The test printing machine was not equipped with downward force or squeegee velocity actuators. The persistent excitation condition was therefore satisfied by manually adjusting $V_{sq}$ and $F_y$ during the printing passes for which data was taken. When implemented on a printing machine with actuation capabilities, convergence should occur within the first few centimeters of squeegee travel. Rapid convergence is important for this technique to be applied to the printing process on-line. To satisfy this requirement, the excitation and estimation operations can be conducted over stencil regions that fall before and after the important print pattern. In doing so, the actual depositions will not be disturbed by varying machine conditions during the printing operation.

Thus, the apparatus shown in FIG. 6B takes as inputs the $F_x$ and $F_y$ and $V_{sq}$ measurements for numerous sets of these three machine parameters associated together. It is known that an approximation of the relation among $F_x$, $F_y$ and $V_{sq}$ is a plane in the $F_x$, $F_y$ and $V_{sq}$ space, defined by the linking parameters $b_i$. Of course, this plane is an idealization, an approximation. A plane that is suitably close to the ideal plane can be identified by identifying numerous real process points (each point is an associated triplet of measured parameters $F_x$, $F_y$ and $V_{sq}$) and identifying a plane that is closest to all of the measured points, within a predetermined range of accuracy. This plane, that relates all of the associated measurements together, is characterized by and thus identifies or measures specific values for the three $b_i$ linking parameters. For each newly measured associated triplet, the apparatus applies a recursive least squares operation to the accumulating number of associated sets of measured machine parameters. After each recursive cycle, the apparatus identifies a new planar relation that is closest, by a least mean squares measure, to all of the associations of measured machine parameters. From the identified, closest relation, new values for the linking parameters $b_i$ are determined on each recursive cycle. These values are thus a measure of the mechanical properties of the printing paste. They can be identified for their own intrinsic value, or can be used as inputs to actuators for the machine parameters, as shown in FIG. 6B.

Nonlinear Approximation Estimation

Figure 13:
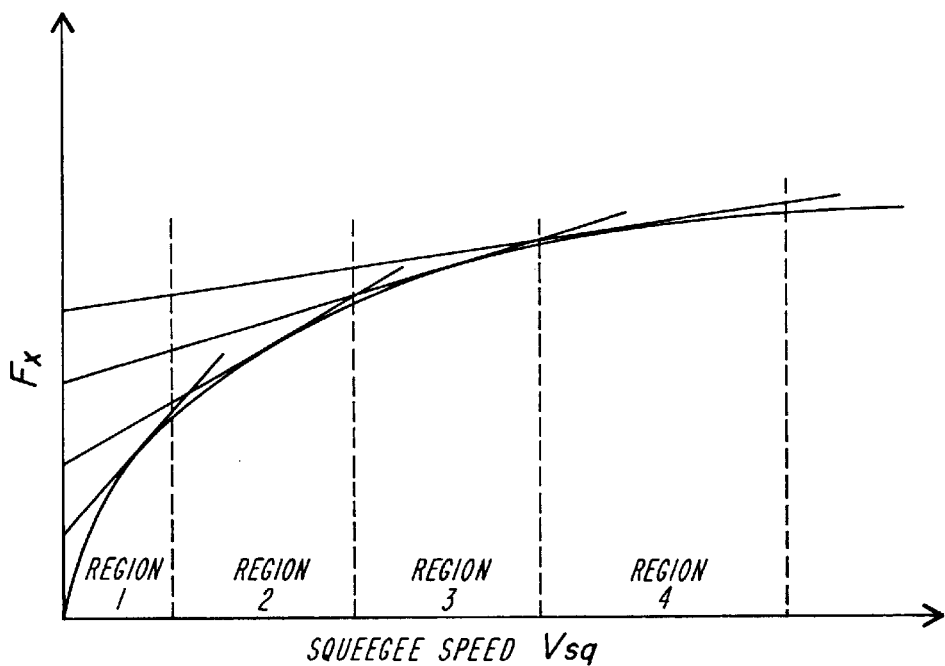
FIG. 13 is a graphical representation of the force in the x direction vs. the squeegee speed, shown by a piecewise linear approximation.

The results obtained for the linear approximation are useful, but they are only meaningful if the estimates of the linking parameters are obtained within a region of linear operations, such as shown in FIG. 7A. That is, for results to be consistent, the condition of persistent excitation must be satisfied over a limited linear region of the $F_x$, $V_{sq}$ curve. Because this curve can be approximated as piecewise linear, different values for $b_1$ and $b_2$ will be estimated depending on the operating region of the squeegee, as shown in FIG. 13.

In order to apply the same estimation scheme to the nonlinear approximation of Equation 29, some mathematical manipulation is required. The first step of the estimation scheme is to estimate $b_2'$ for constant squeegee velocity $V_{sq}$. When the squeegee speed is constant, Equation 29, collapses to the form, $$F_x = \text{constant} + b_2'F_y. \qquad (35)$$

Convergence to the constant and $b_2'$ using the least squares method is rapid, since only one slope, $b_2'$ and one intercept (the constant) must be estimated. (Thus, the relations discussed above are thought of as lines, rather than planes in $F_x$–$F_y$ space.) The linking term $b_2'$ is associated with friction due to squeegee wear and the interface between the squeegee and stencil.

Because any variation to the friction coefficient will occur over a long time scale relative to the time associated with any paste changes, once $b_2'$ is determined, the product $b_2'F_y$ can be treated as a known value (since $F_y$ can be measured)

and is moved to the left hand side of Equation 29, giving the following expression:

$$F_x - b_2'F_y = b_1'V_{sq}^{b'4}. \quad (36)$$

By taking the logarithm of both sides of Equation 36, the equation is recast into a form whereby the unknown linking coefficients $b_1'$ and $b_4'$ are linearly involved (in a space defined by axes for $\log(F_x - b_2'F_y)$ and $\log(V_{sq})$) with measurable machine parameters and machine settings:

$$\log(F_x - b_2'F_y) = b_4'\log(V_{sq}) + \log(b_1'). \quad (37)$$

In this form, the least squares estimation technique can be applied to obtain on-line estimates of the values for linking coefficients for friction ($b_2'$), paste thickness ($b_1'$) and non-Newtonian behavior ($b_4'$). This estimation scheme is a two phase process; paste material parameters $b_1'$ and $b_4'$ are obtained separately from and after the friction coefficient $b_2'$. By frequently repeating this two step estimation process, values for all of the linking parameters can be determined in real time. The apparatus described above, with automatic means for actuating the normal force $F_x$ and the squeegee velocity $V_{sq}$, is typically able to determine these linking parameter values over the course of about five cm of printing. Typically, five variations in $F_y$ and five variations in $V_{sq}$ are adequate to provide convergence. To overcome noise in the system, five samples at each value are taken. The hardware described can easily make the calculations to converge upon the linking parameters in five cm, at a printing speed of nine cm/s.

Figure 15:
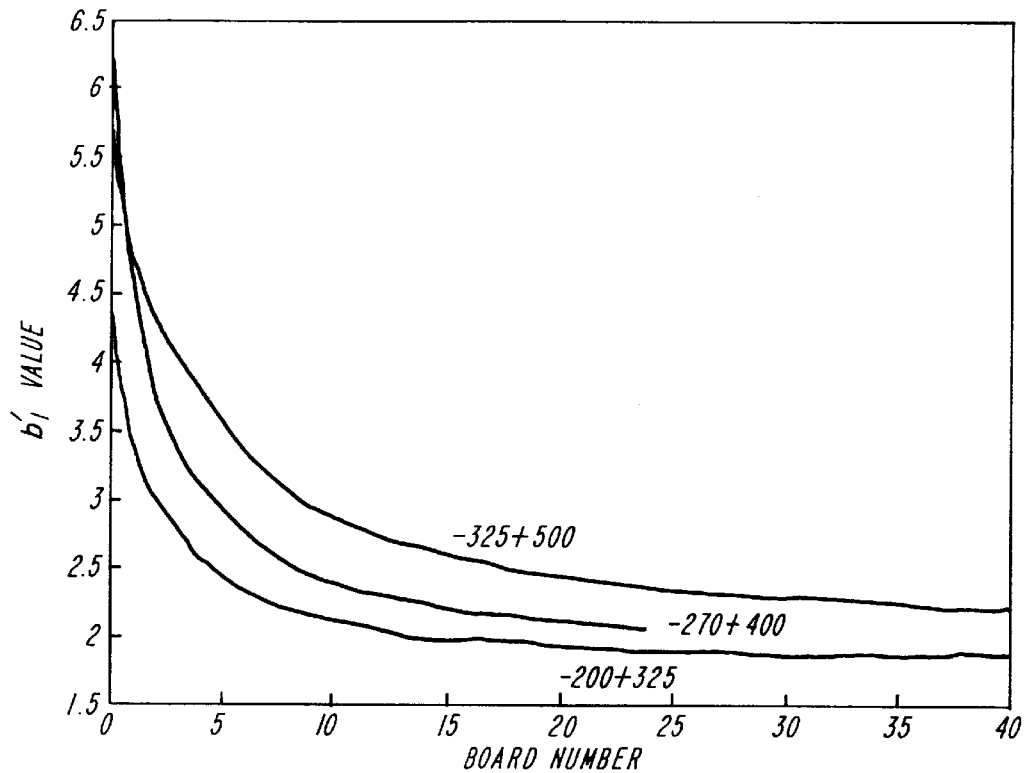
FIG. 15 is a graphical representation of estimates of the thickness (k) linking parameters, $b'_1$ for three different pastes.
Figure 16:
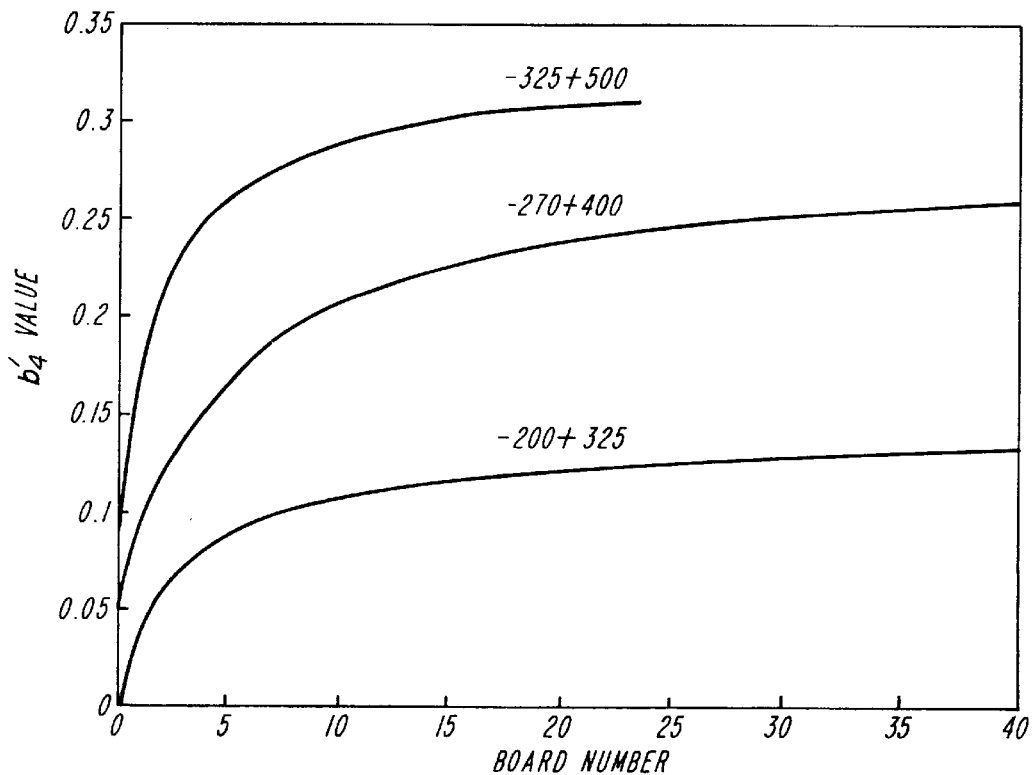
FIG. 16 is a graphical representation of estimates of the non-Newtonian (n) linking parameters, $b'_4$ for three different pastes.
Figure 17:
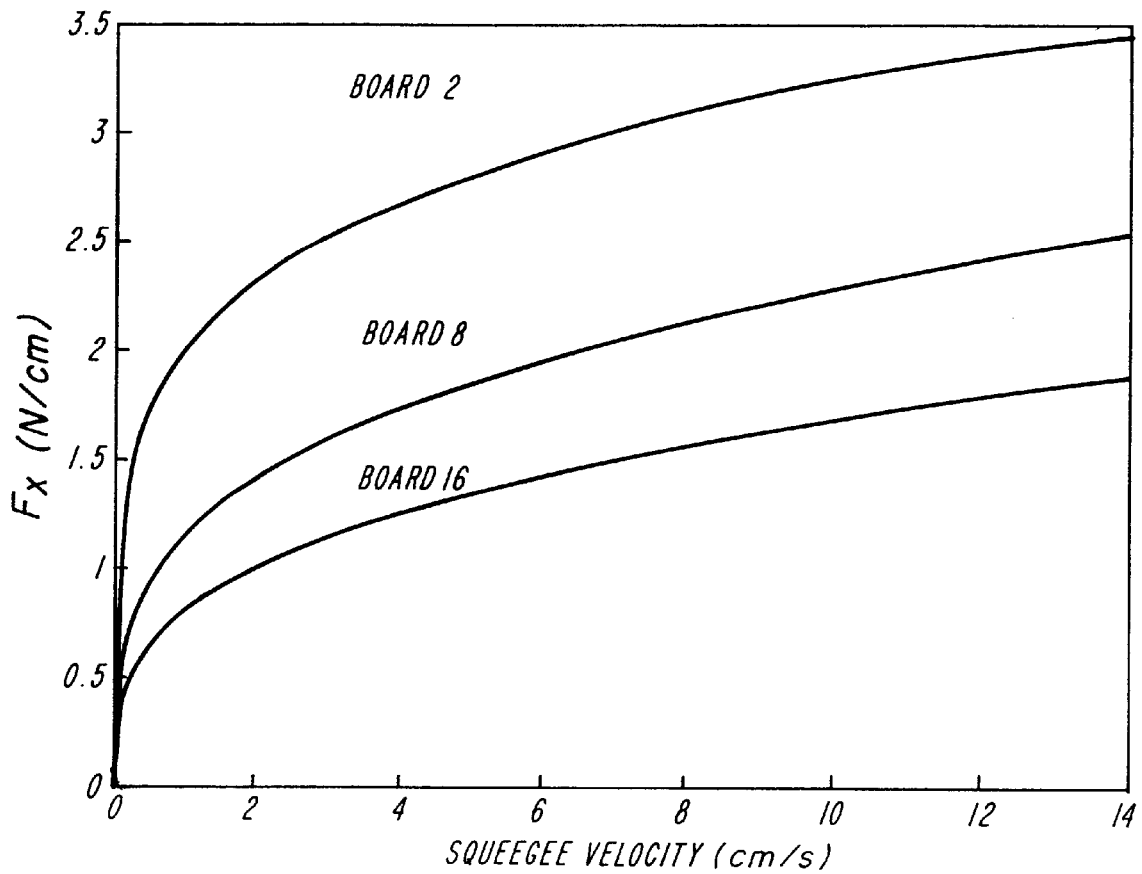
FIG. 17 is a graphical representation of force in the x direction vs. squeegee velocity, using estimated linking parameters $b'_i$, after 16 prints.

Estimates of the power law coefficients $b_1'$ for different solder pastes using the nonlinear relations of Equation 29 are shown in FIGS. 15 ($b_1'$, proportional to thickness k) and 16 (non-Newtonian exponent n). The corresponding power law relations for the estimated $b_i'$ of the –325+500 paste over the course of 16 printing passes are shown in FIG. 17. Measurements of $b_1'$ and $b_4'$ were used to plot FIG. 17, to generate the smooth curves shown.

The invention has been described above primarily with respect to the apparatus aspects, with some explanation of the steps conducted in its use. The following discussion focuses on the steps of an embodiment of the invention, where the application can tolerate results consistent with the approximations that the fluid is Newtonian, and is illustrated in flow chart form by FIG. 18. The process begins at 1902. A board is loaded under the stencil, and the printing paste is charged in position to be printed. The squeegee is positioned at one edge of the stencil. As the squeegee begins to move forward, towards the pattern to be printed, typically defined by stencil apertures, the apparatus applies 1904 a known normal force $F_y$ and moves the squeegee at a known velocity $V_{sq}$. These machine parameters $F_y$ and $V_{sq}$ are also measured. The force $F_x$, on the squeegee in the direction of motion tangential to the stencil, is measured 1906 (as well as the angle of the squeegee, if the angle of the squeegee is variable). The three (four) measured values associate a set of machine parameters together. (The members of an associated set are measured substantially simultaneously. What is required is that they be measured close enough in time such that none of the members of the set have changed during the time it takes to measure all members of the set.) What is desired is a relation that is closest to the relation that describes all such associations of the three machine parameters.

A recursive least squares operation is conducted 1908 by signal processing apparatus to determine the linking parameters $b_1$, $b_2$, and $b_3$. (Meaningful results are not obtained until after at least three associated sets are measured.) Next, a condition is tested 1910 to determine if the squeegee has traveled a sufficient distance to have arrived at the print pattern apertures on the stencil. If yes, the process continues to adjust 1912 the machine parameters of squeegee speed, normal force, and squeegee angle, based on the measured linking parameters $b_1$, $b_2$ and $b_3$.

If the stencil apertures have not yet been reached, the process returns to again apply 1904 a normal force and a velocity to the squeegee. The apparatus will apply a different normal force and a different velocity, to generate a different point within an abstract space defining the association of the three machine parameter values, through which the recursive least squares technique is fitting a plane. Again the tangential force $F_x$ on the squeegee in the direction of motion is measured 1906 as well as the angle, if variable. This new measured force is associated with the $F_y$ and $V_{sq}$ and is related to the other known associations of machine parameters to arrive at a new relation, defined by new values for the three linking parameters $b_1$, $b_2$ and $b_3$.

The steps of changing the normal force and velocity and measuring the tangential force $F_x$ and using those measurements to identify a relation among the parameters, continues numerous times, so that the most appropriate relation can be determined, thereby determining the most appropriate measure of the linking parameters $b_1$, $b_2$ and $b_3$. From these measured linking parameters, if desired, it is possible to determine the conventional mechanical paste properties of viscosity and coefficient of friction. It is also possible to identify actuation values for the downward force and the squeegee velocity to achieve desired results.

Thus, in a typical case, during the few centimeters between the starting position of the squeegee and the pattern, the method will converge on linking parameters that can be used in an on-line fashion as the operator prefers, for instance to change 1912 the speed, force, squeegee angle, etc.

Next, the paste is printed 1914 through the stencil onto the substrate. A test is taken 1916 to determine whether the squeegee has passed beyond the pattern. If not, the method returns to continue printing 1914. If the pattern has been passed, the method continues to again conduct an iterative actuate and measure process, to collect more information to further specify the linking parameters. Thus, the normal force and the velocity are changed 1924, the force in the printing direction is measured 1926, and the linking parameters are determined 1928, such as by a recursive least squares method. A test is conducted 1930 to determine if the end of the squeegee path has been reached. If not, the method returns to again change the normal force, etc. 1924. If the end of the path has been reached, another test is conducted 1932 to determine if another substrate is to be printed upon. If yes, the process returns to the beginning. If no, the process ends 1934.

Figure 19A:
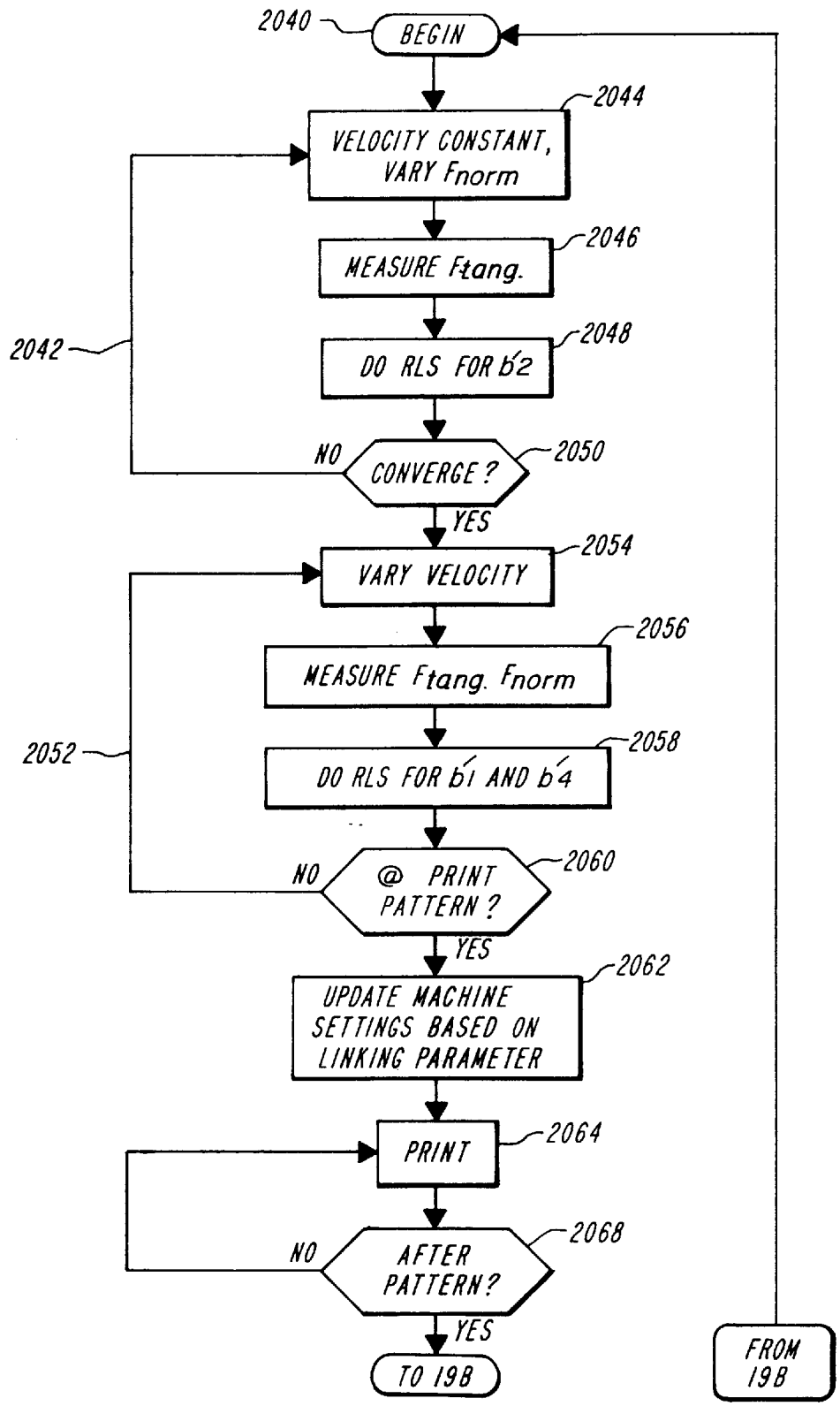
FIGS. 19A and 19B are a schematic representation in flow chart form of a method of the invention that is not based on the assumption that, in the region of interest, the printing medium is Newtonian.
Figure 19B:
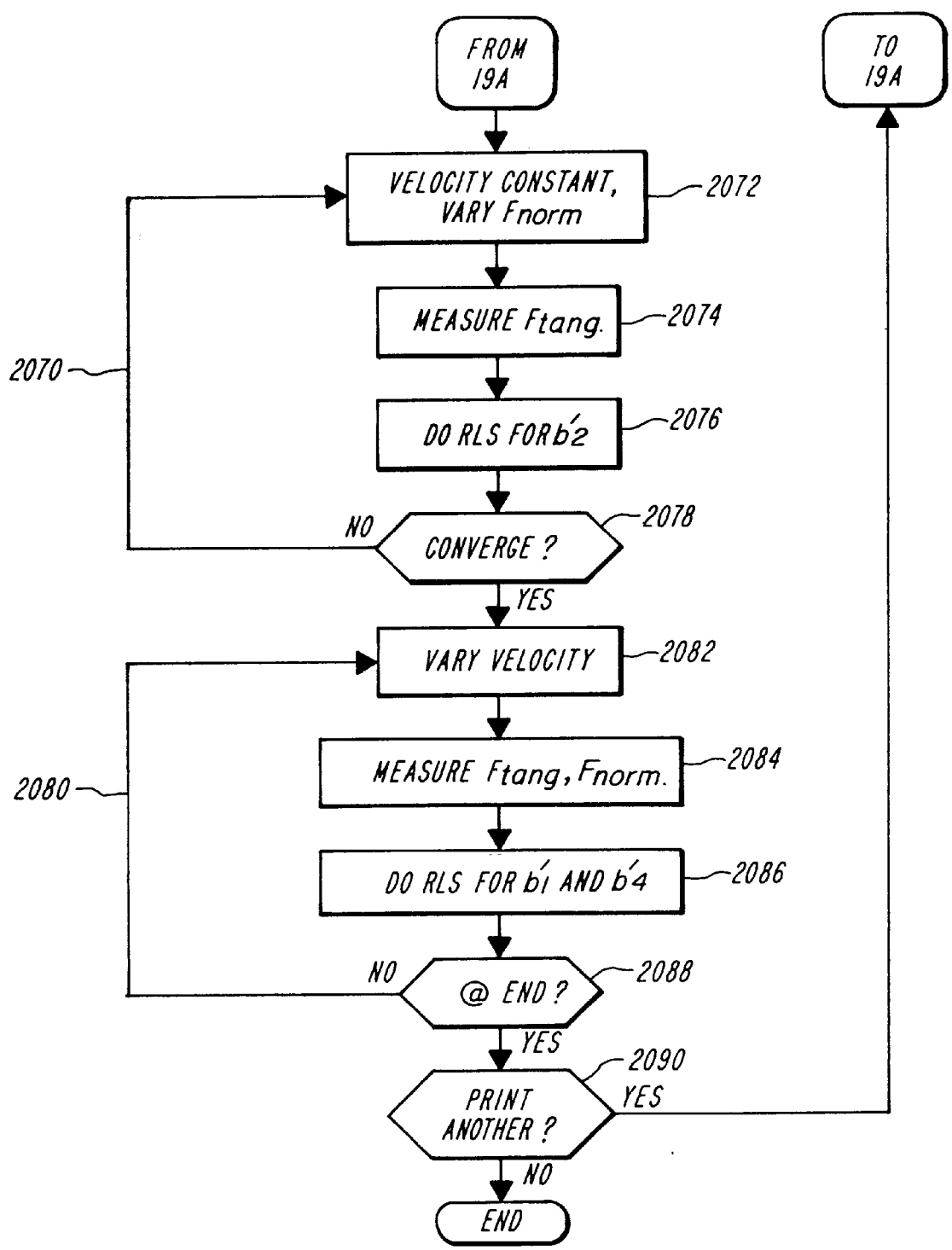

A more exacting method of the invention assumes non-Newtonian paste properties. This method is used when the application is not able to tolerate inaccuracies due to the non-Newtonian properties. It is shown in flow chart form in FIGS. 19A and 19B. The general pattern of steps is similar to that shown for the embodiment of the method illustrated with FIG. 18, identifying linking parameters both before and after printing takes place. However, the parameter identifications steps differ, in that a two phase process is conducted. In the first phase, 2042, the normal force is varied 2044 and the velocity is held constant over the course of several variations in normal force. For each variation in normal force, the tangential force in the printing direction $F_x$ is measured 2046, after which associated parameters related to the friction coefficient ($b_2'$) and an intermediate constant are fit to a relationship, for instance using a recursive least squares method. A test is conducted 2050 to determine if the relation for $b_2'$ and the constant has converged. If not, the method returns to again vary the normal force 2044 and again measure the tangential force in the printing direction.

If the relation has converged, the process continues to the second pre-printing phase 2052, where the velocity is varied 2054 and the force $F_x$ in the printing direction and the normal force $F_y$ are measured 2056. (The normal force $F_y$ may be varied or kept constant.) A fitting operation is conducted 2058 to identify appropriate parameter values for the thickness ($b_1'$) and exponent ($b_4'$) linking parameters. A test is conducted 2060 to determine whether the squeegee has reached the pattern to be printed. If not, the method returns to vary 2054 the squeegee velocity again, and again to measure the linking parameters by a recursive, curve fitting method.

If the printing pattern has been reached, the machine settings, are set 2060, based on the measured linking parameters, and the paste pattern is printed, as discussed above. After the pattern has been printed, the method again estimates the linking parameters, through two phases identical to the pre-printing phases 2042 and 2052.

As has been mentioned above, the machine settings may be changed in response to the measured linking parameters. To a significant extent, how those machine settings will be changed will depend on the specific geometry of the device being used, the type of printing medium, the type of medium spreader, etc. The operator will learn how to change the machine settings based on the changes in linking parameters. For instance, in some circumstances as $b_1$ decreases, indicating a general thinning of the print medium, $V_{sq}$ should be increased. If the non-Newtonian assumptions are being followed, as $b_1'$ decreases, $F_y$ should be increased and perhaps $\alpha$ should be decreased (bringing the squeegee surface closer to the stencil surface) to account for the decrease in thickness.

Figure 14:
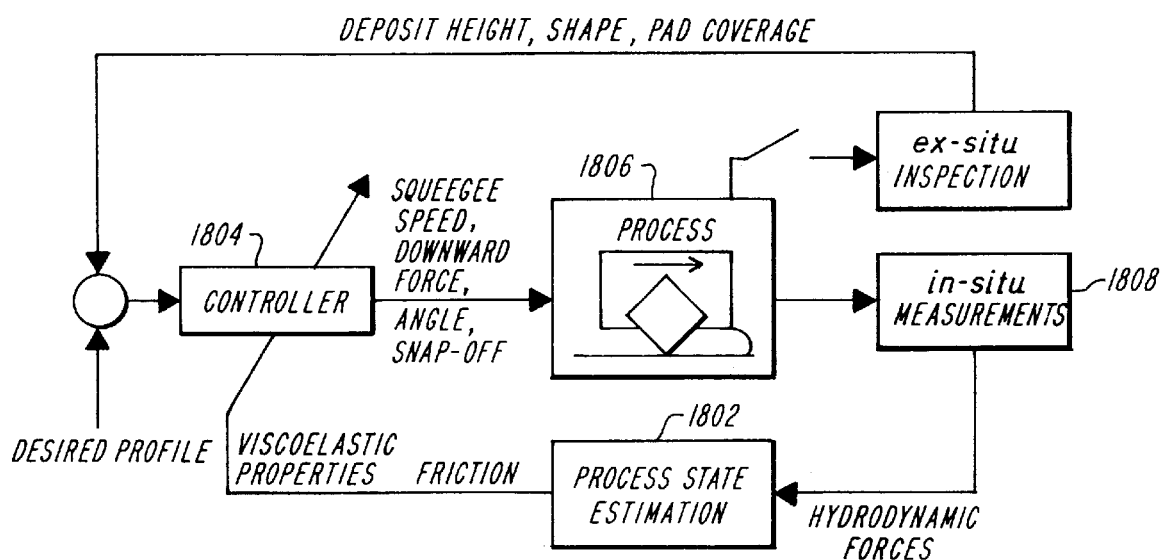
FIG. 14 is a schematic representation in block diagram form of a closed loop control apparatus for a stencil printing operation.

This process is shown schematically with reference to FIG. 14 which shows, schematically, apparatus for testing and controlling solder paste application. A paste application machine 1806 is equipped with a squeegee, and actuators for changing the speed, normal force and squeegee angle. As the machine applies paste, machine measurements are taken by a set of measurement devices 1808, such as strain gages and potentiometers discussed above. These measurements are provided to apparatus 1802 for estimating the state of the interaction between the solder paste, squeegee and stencil, typically an appropriately programmed general purpose computer, such as discussed above. This estimator 1802 generates the linking parameters, as discussed above, which are passed to a controller 1804. The controller 1804 takes as inputs the linking parameters, and generates as outputs changes to the machine parameters of squeegee speed, normal force and squeegee angle. These machine parameter change signals are passed to the appropriate actuators on the paste application machine 1806. The controller 1804 uses guidelines as discussed above, for determining what the machine property change signals should be.

An additional input may be provided to the controller 1804. This additional input comes from a comparator 1812, which compares the specified or desired paste profile (deposit height, shape, pad coverage) with the actual paste profile determined by inspecting the printed product after printing at an inspection station 1810. The inspection station is not typically part of the on-line, real time process.

However, the machine measurement devices are incorporated into the device such that they operate in real-time, as the pattern is being printed.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

The invention can be used with any printing operation where a print medium is spread by a spreading device similar to a squeegee. Possible print media include but are not limited to solder paste, ink, paint or dye. There can be a stencil, although there need not be. In fact, the invention can be used with any operation where a viscous fluid is to be spread over a surface, such as plastering, cement spreading, spreading of viscous floor covering, such as used on tennis courts and roads. The invention can be used with apparatus where the squeegee component moves and the surface remains stationary, or where the surface moves and the squeegee component stays at rest. The specific form of the Newtonian and non-Newtonian approximations above need not be used. Other approximations that are suitable for a particular print medium and environment may be used. As long as the general technique of measuring machine parameters is used along with fitting a relation to numerous associated sets of machine parameters, to identify useful linking parameters, the following claims are intended to cover such an apparatus or use.

Having described the invention, what is claimed is:

1. An apparatus for measuring values of linking parameters that are related to mechanical properties of a printing medidium and the printing environment, for use with printing apparatus in which a media spreading member moves relative to a surface, causing printing medium to be moved across said surface, said apparatus comprising:
   a. means for measuring a machine parameter that represents the total force applied to said media spreading member by said surface and said printing medium;
   b. means for resolving said measured force parameter into components equivalent to two orthogonal components;
   c. means for measuring a machine parameter that represents the velocity of the media spreading member relative to said surfacer; and
   d. means for calculating values of said linking parameters by identifying specific instance of a predetermined general relation among said measured machine parameters of velocity, first force component and second orthogonal force component and said linking parameters, which specific instance constrains each of said linking parameters to a specific value, said means for identifying comprising means for evaluating at least three sets of said measured machine parameters, each set having a measured value for said parameters of velocity, first force component and second orthogonal force component, and, based on said evaluation, identifying a specific instance of said general relation with which all of said sets of measured machine parameters agree within a predetermined level of accuracy.

2. The apparatus of claim 1, said means for evaluating the sets of machine parameters and identifying a specific instance of said general relation comprising means for applying a recursive least squares relationship selecting technique to said at least three sets of measured machine parameters.

3. The apparatus of claim 1, said means for evaluating the sets of machine parameters and identifying a specific instance of said general relation comprising means for applying a statistical selection technique to said at least three sets of measured machine parameters.

4. The apparatus of claim 1, said means for evaluating at least three sets comprising:
   a. means for changing the value of said machine parameter of spreading member velocity;
   b. means for changing the value of a force component equivalent to one of said two orthogonal components;
   c. means for substantially simultaneously measuring said machine parameters of spreading member velocity, and said force components equivalent to two orthogonal components and means for associating together said measured machine parameters that have been measured simultaneously;
   d. means for recording said associated measured machine parameters for at least three different sets of measured machine parameters; and
   e. means for comparing said at least three different recorded sets of measured machine parameters to at least one specific instance of said general relation.

5. The apparatus of claim 1, said means for evaluating at least three sets comprising:
   a. means for changing the value of said machine parameter of spreading member velocity;
   b. means for changing the value of a force component equivalent to one of said two orthogonal components, which force component is normal to said surface;
   c. means for substantially simultaneously measuring said machine parameters of spreading member velocity, and said force components equivalent to two orthogonal components and means for associating together said measured machine parameters that have been measured simultaneously;
   d. means for recording said associated measured machine parameters for at least three different sets of measured machine parameters;
   e. means for maintaining said machine parameter of spreading member velocity constant and changing the value of said machine parameter of normal force through a plurality of different values of spreading member velocity;
   f. means for comparing at least two of said different recorded sets of measured machine parameters; and
   g. means for determining the value of a first linking parameter that corresponds to a coefficient of friction between said surface and said media spreading member, based on a comparison of said at least two of said recorded sets.

6. The apparatus of claim 5, said means for evaluating at least three sets further comprising:
   a. means for comparing at least two of said different associated and recorded sets of measured machine parameters, measured at different values of the spreading member velocity; and
   b. means for determining, based on a comparison of said at least two recorded sets, measured at different spreading member velocities, and said first linking parameter, the values of a second and a third linking parameter.

7. The apparatus of claim 6, said second linking parameter being linearly related to the thickness k of said printing medium.

8. The apparatus of claim 7, said second linking parameter comprising $$b'_1 = 2k\ln\left(\frac{L}{a}\right)f_1(\alpha) - 2k\eta\ln\left(\frac{L}{a}\right)f_2(\alpha),$$

where $f_1(\alpha)$ and $f_2(\alpha)$ are trigonometric functions of the angle of inclination between the media spreading member and the surface, $\eta$ is the coefficient of friction between the medium spreading member and the surface and L/a is a measure of the volume of printed medium being spread.

9. The apparatus of claim 6, said third linking parameter comprising a measure of the degree to which said print medium exhibits non-Newtonian behavior.

10. An apparatus for measuring values of linking parameters that are related to mechanical properties of a printing medium and the printing environment, for use with printing apparatus in which a media spreading member moves relative to a surface, causing printing medium to be moved across said surface, one of said linking parameters being linearly related to the thickness k of said printing medium, comprising $$b'_1 = 2k\ln\left(\frac{L}{a}\right)f_1(\alpha) - 2k\eta\ln\left(\frac{L}{a}\right)f_2(\alpha),$$

where $f_1(\alpha)$ and $f_2(\alpha)$ are trigonometric functions of the angle of inclination between the media spreading member and the surface, $\eta$ is the coefficient of friction between the medium spreading member and the surface and L/a is a measure of the volume of print medium being spread, said apparatus comprising:
   a. means for measuring a machine parameter that represents the total force applied to said media spreading member by said surface and said printing medium;
   b. means for resolving said measured force parameter into components equivalent to two orthogonal components;
   c. means for measuring a machine parameter that represents the velocity of the media spreading member relative to said surface; and
   d. means for calculating values of said linking parameters by identifying a specific instance of a predetermined general relation among said measured machine parameters of velocity, first force component and second orthogonal force component and said linking parameters, which specific instance constrains each of said linking parameters to a specific value.

11. An apparatus for measuring values of linking parameters that are related to mechanical properties of a printing medium and the printing environment, for use with printing apparatus in which a media spreading member moves relative to a surface, causing printing medium to be moved across said surface, said apparatus comprising:
   a. means for measuring a machine parameter that represents the total force applied to said media spreading member by said surface and said printing medium;
   b. means for resolving said measured force parameter into components equivalent to two orthogonal components;
   c. means for measuring a machine parameter that represents velocity of the media spreading member relative to said surface; and
   d. a computer, programmed to generate values of said linking parameters by identifying a specific instance of a predetermined general relation among said measured machine parameters of velocity, first force component and second orthogonal force component and said linking parameters, which specific instance constrains said linking parameters to specific values, thus measuring said values of said linking parameters, said programming to identify a specific instance of a relation comprising programming to evaluate at least three sets of said measured machine parameters, each set having a measured value for said parameters of velocity, first force component and second orthogonal force component, and, based on said evaluation, identify a specific instance of said general relation with which all of said sets of measured machine parameters agree within a predetermined level of accuracy.

12. The apparatus of claim 11, said programming of said computer to evaluate the sets of machine parameters and identify a specific instance of said general relation comprising programming for applying a recursive least squares relationship selecting technique to said at least three sets of measured machine parameters.

13. A method for measuring values of linking parameters that are related to mechanical properties of a printing medium and the printing environment, for use with printing apparatus in which a media spreading member moves relative to a surface, causing printing medium to be moved across said surface, said method comprising the steps of:
   a. measuring at least one machine parameter that represents the total force applied to said media spreading member by said surface and said printing medium;
   b. resolving said measured at least one force parameter into components equivalent to two orthogonal components;
   c. measuring a machine parameter that represents the velocity of the media spreading member relative to said surface; and
   d. measuring said linking parameters by identifying a specific instance of a predetermined general relation among said measured machine parameters of velocity, first force component and second orthogonal force component and said linking parameters, which specific instance constrains said linking parameters to specific values by evaluating at least three sets of said measured machine parameters, each set having a measured value for said parameters of velocity, first force component and second orthogonal force component, and, based on said evaluation, identifying a specific instance of said general relation with which all of said sets of measured machine parameters agree within a predetermined level of accuracy.

14. The method of claim 13, said step of evaluating the sets of machine parameters and identifying a specific instance of a general relation comprising applying a recursive least squares relationship selecting technique to said at least three sets of measured machine parameters.

15. The method of claim 13, said step of evaluating at least three sets comprising the steps of:
   a. changing the value of said machine parameter of spreading member velocity;
   b. while changing the value of said machine parameter of spreading member velocity, changing the value of a force component equivalent to one of said two orthogonal components;
   c. substantially simultaneously measuring said machine parameters of spreading member velocity, and said force components equivalent to two orthogonal components and associating together said measured machine parameters that have been measured substantially simultaneously;
   d. recording said associated measured machine parameters for at least three different sets of measured machine parameters; and
   e. comparing said at least three different recorded sets of measured machine parameters to at least one specific instance of said general relation.

16. The method of claim 13, said step of evaluating at least three sets comprising:
   a. maintaining the value of said machine parameter of spreading member velocity constant while changing the value of said machine parameter of the first force component through a plurality of different values of said first force component;
   b. substantially simultaneously measuring said machine parameters of spreading member velocity, and said force components equivalent to two orthogonal components and associating together said measured machine parameters that have been measured simultaneously;
   c. recording said associated measured machine parameters for at least two different sets of measured machine parameters; and
   d. comparing at least two of said different recorded sets of measured machine parameters; and
   e. determining the value of a first linking parameter that corresponds to a coefficient of friction between said surface and said media spreading member, based on a comparison of said at least two recorded sets.

17. The method of claim 13, said step of evaluating at least three sets further comprising the steps of:
   a. changing the value of said machine parameter of spreading member velocity through a plurality of different instances of spreading member velocity;
   b. substantially simultaneously measuring said machine parameters of spreading member velocity, and said force components equivalent to two orthogonal components and associating together said measured machine parameters that have been measured substantially simultaneously;
   c. recording said associated measured machine parameters for at least two different sets of measured machine parameters; and
   d. comparing at least two of said different recorded sets of measured machine parameters, measured at different values of the spreading member velocity; and
   e. based on said comparison of at least two different sets recorded at different spreading member velocities and based on said first linking parameter, determining the values of a second and a third linking parameter.

18. A method for measuring values of linking parameters that are related to mechanical properties of a printing medium and the printing environment, for use with printing apparatus in which a media spreading member moves relative to a surface, causing printing medium to be moved across said surface, one of said linking parameters $b_1'$, being linearly related to the thickness k of said printing medium, comprising $$b_1' = 2k\ln\left(\frac{L}{a}\right)f_1(\alpha) - 2k\eta\ln\left(\frac{L}{a}\right)f_2(\alpha),$$

where $f_1(\alpha)$ and $f_2(\alpha)$ are trigonometric functions of the angle of inclination between the media spreading member and the surface, $\eta$ is the coefficient of friction between the medium spreading member and the surface and L/a is a constant measure of the volume of print medium being spread, said method comprising the steps of:

a. measuring at least one machine parameter that represents the total force applied to said media spreading member by said surface and said printing medium;

b. resolving said measured at least one force parameter into components equivalent to two orthogonal components;

c. measuring a machine parameter that represents the velocity of the media spreading member relative to said surface; and d. measuring said linking parameters by identifying a specific instance of a predetermined general relation among said measured machine parameters of velocity, first force component and second orthogonal force component and said linking parameters, which specific instance constrains said linking parameters to specific values.

* * * * *